United States Patent
Iida et al.

(10) Patent No.: US 9,548,279 B2
(45) Date of Patent: Jan. 17, 2017

(54) CONNECTION MEMBER, SEMICONDUCTOR DEVICE, AND STACKED STRUCTURE

(71) Applicant: Kabushiki Kaisha Toshiba, Minato-ku (JP)

(72) Inventors: Atsuko Iida, Yokohama (JP); Tadahiro Sasaki, Nerima (JP); Nobuto Managaki, Kawasaki (JP); Yutaka Onozuka, Yokohama (JP); Hiroshi Yamada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 3 days.

(21) Appl. No.: 14/466,493

(22) Filed: Aug. 22, 2014

(65) Prior Publication Data

US 2015/0084208 A1  Mar. 26, 2015

(30) Foreign Application Priority Data

Sep. 25, 2013 (JP) ................................. 2013-197853

(51) Int. Cl.
*H01L 23/48* (2006.01)
*H01L 23/52* (2006.01)
(Continued)

(52) U.S. Cl.
CPC .............. *H01L 24/02* (2013.01); *H01L 23/04* (2013.01); *H01L 23/49822* (2013.01); *H01L 23/49827* (2013.01); *H01L 23/5389* (2013.01); *H01L 23/60* (2013.01); *H01L 23/66* (2013.01); *H01L 24/03* (2013.01); *H01L 24/19* (2013.01); *H01L 24/20* (2013.01); *H01L 24/24* (2013.01); *H01L 24/82* (2013.01); *H01L 24/95* (2013.01); *H01L 24/96* (2013.01); *H05K 1/117* (2013.01); *H05K 3/403* (2013.01); *H01L 24/05* (2013.01); *H01L 24/16* (2013.01); *H01L 2224/0239* (2013.01);
(Continued)

(58) Field of Classification Search
CPC .... H01L 23/49822; H01L 24/02; H01L 23/49; H01L 23/48; H01L 23/52
USPC .......... 257/531, 713, 741, 774, 699, E23.19; 438/610, 643
See application file for complete search history.

(56) References Cited

U.S. PATENT DOCUMENTS 5,523,622 A * 6/1996 Harada .................. H01L 23/13
257/686
6,307,450 B2 10/2001 Takahashi et al.
(Continued)

FOREIGN PATENT DOCUMENTS

JP 11-289046 10/1999
JP 11-346103 12/1999
(Continued)

*Primary Examiner* — Yuanda Zhang
*Assistant Examiner* — Sheikh Maruf
(74) *Attorney, Agent, or Firm* — Oblon, McClelland, Maier & Neustadt, L.L.P.

(57) ABSTRACT

A connection member according to an embodiment includes a dielectric material, a penetrating via penetrating through the dielectric material, a first metal plane provided in the dielectric material, the first metal plane being perpendicular to an extension direction of the penetrating via, the first metal plane crossing the penetrating via, and a second metal plane provided n or on the dielectric material in parallel with the extension direction of the penetrating via, the second metal plane connected to the first metal plane.

6 Claims, 43 Drawing Sheets

(51) Int. Cl.
    *H01L 29/40*          (2006.01)
    *H01L 23/00*          (2006.01)
    *H01L 23/498*        (2006.01)
    *H01L 23/538*        (2006.01)
    *H01L 23/66*          (2006.01)
    *H01L 23/04*          (2006.01)
    *H01L 23/60*          (2006.01)
    *H05K 1/11*           (2006.01)
    *H05K 3/40*           (2006.01)

(52) U.S. Cl.
    CPC ............... *H01L 2224/02311* (2013.01); *H01L 2224/02371* (2013.01); *H01L 2224/02381* (2013.01); *H01L 2224/0345* (2013.01); *H01L 2224/0401* (2013.01); *H01L 2224/04105* (2013.01); *H01L 2224/05624* (2013.01); *H01L 2224/05644* (2013.01); *H01L 2224/05647* (2013.01); *H01L 2224/12105* (2013.01); *H01L 2224/16225* (2013.01); *H01L 2224/2101* (2013.01); *H01L 2224/211* (2013.01); *H01L 2224/214* (2013.01); *H01L 2224/2105* (2013.01); *H01L 2224/24195* (2013.01); *H01L 2224/82106* (2013.01); *H01L 2224/95* (2013.01); *H01L 2224/96* (2013.01); *H01L 2924/15788* (2013.01); *H01L 2924/19105* (2013.01); *H05K 2201/0919* (2013.01)

(56) References Cited

U.S. PATENT DOCUMENTS

| | | | | |
|---|---|---|---|---|
| 6,891,266 | B2* | 5/2005 | Kinayman | H01L 23/055 257/713 |
| 2002/0050872 | A1* | 5/2002 | Terashima | H01P 1/203 333/99 S |
| 2002/0079572 | A1* | 6/2002 | Khan | H01L 23/3677 257/707 |
| 2002/0139578 | A1* | 10/2002 | Alcoe | H01L 23/49822 174/262 |
| 2003/0151133 | A1* | 8/2003 | Kinayman | H01L 23/055 257/713 |
| 2005/0006752 | A1* | 1/2005 | Ogawa | H01L 21/4857 257/700 |
| 2005/0139987 | A1* | 6/2005 | Okada | H01L 23/49822 257/700 |
| 2005/0269693 | A1* | 12/2005 | Green | H05K 3/366 257/723 |
| 2005/0286198 | A1* | 12/2005 | Anthony | H01L 23/49822 361/118 |
| 2006/0043601 | A1 | 3/2006 | Pahl | |
| 2007/0075405 | A1* | 4/2007 | Ye | H01L 23/49816 257/666 |
| 2007/0109709 | A1* | 5/2007 | Anthony | H01G 4/35 361/118 |
| 2008/0080112 | A1* | 4/2008 | Lin | H01L 21/76816 361/56 |
| 2008/0290524 | A1* | 11/2008 | Lanzerotti | H01L 21/76898 257/770 |
| 2010/0001906 | A1* | 1/2010 | Akkermans | H01L 23/66 343/700 MS |
| 2010/0213492 | A1* | 8/2010 | Lee | H05B 33/22 257/98 |
| 2010/0232200 | A1* | 9/2010 | Shepard | G11C 13/0004 365/51 |
| 2010/0246152 | A1* | 9/2010 | Lin | G06F 1/16 361/783 |
| 2011/0170268 | A1* | 7/2011 | Takemura | H01L 23/552 361/748 |
| 2012/0153435 | A1* | 6/2012 | Haba | H01L 23/13 257/532 |
| 2012/0212384 | A1* | 8/2012 | Kam | H01Q 1/2283 343/767 |
| 2012/0228755 | A1 | 9/2012 | Nagano et al. | |
| 2013/0050972 | A1* | 2/2013 | Mohammed | H05K 3/4602 361/807 |
| 2013/0270711 | A1* | 10/2013 | Hebding | H01L 21/768 257/774 |
| 2014/0268614 | A1* | 9/2014 | Zhang | H01L 21/768 361/782 |
| 2014/0353828 | A1* | 12/2014 | Edelstein | H01L 21/76885 257/751 |
| 2015/0206838 | A1* | 7/2015 | Brunschwiler | H01L 23/5227 257/531 |

FOREIGN PATENT DOCUMENTS

| | | |
|---|---|---|
| JP | 2002-246536 | 8/2002 |
| JP | 2007-158920 | 6/2007 |
| JP | 2008-288660 | 11/2008 |
| JP | 2009-239147 | 10/2009 |
| JP | 2010-123649 | 6/2010 |
| JP | 4636882 | 2/2011 |
| JP | 2012-190855 | 10/2012 |

\* cited by examiner

FIG.3A
FIG.3B
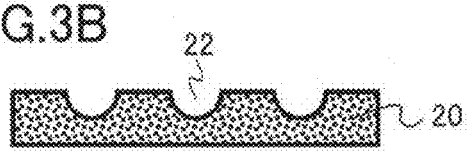
FIG.3C
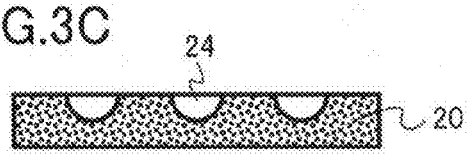
FIG.3D
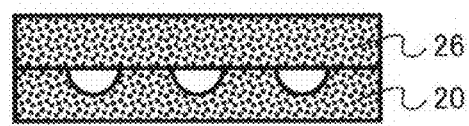
FIG.3E
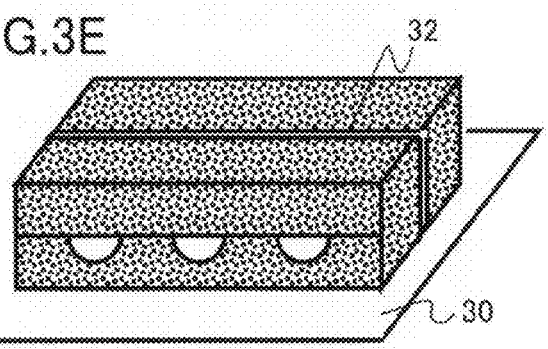
FIG.3F METAL PATTERN A
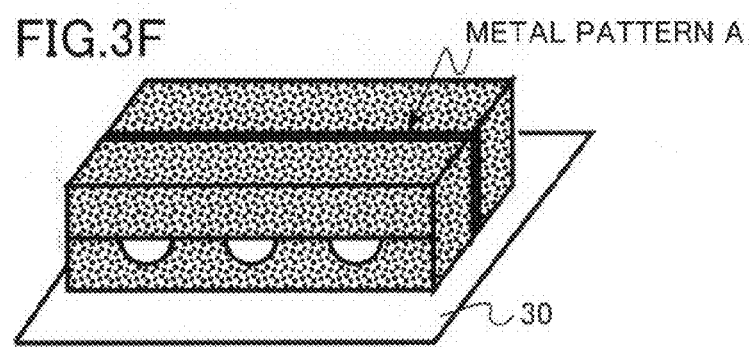
FIG.3G METAL PATTERN B
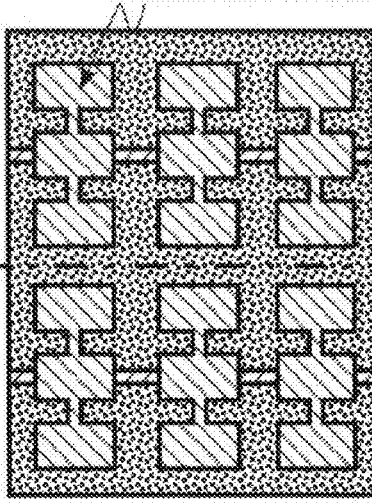
FIG.3H METAL PATTERN B
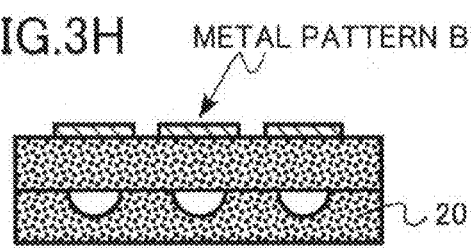

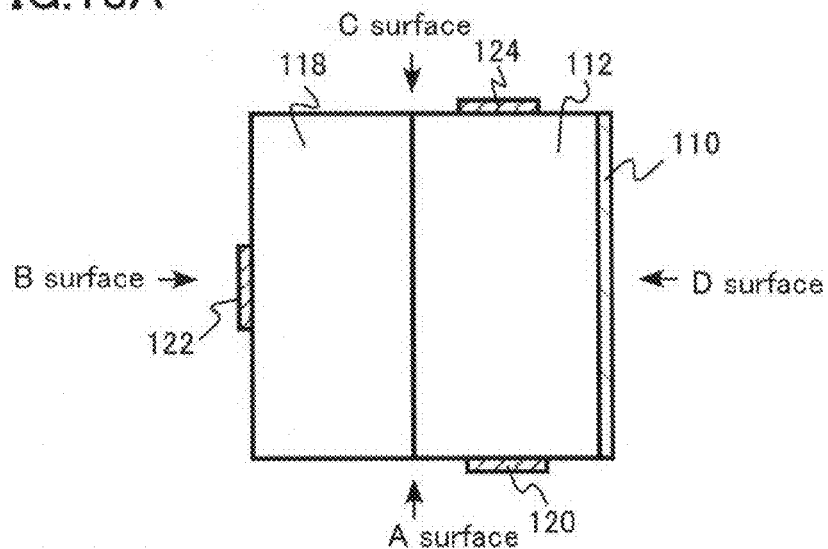
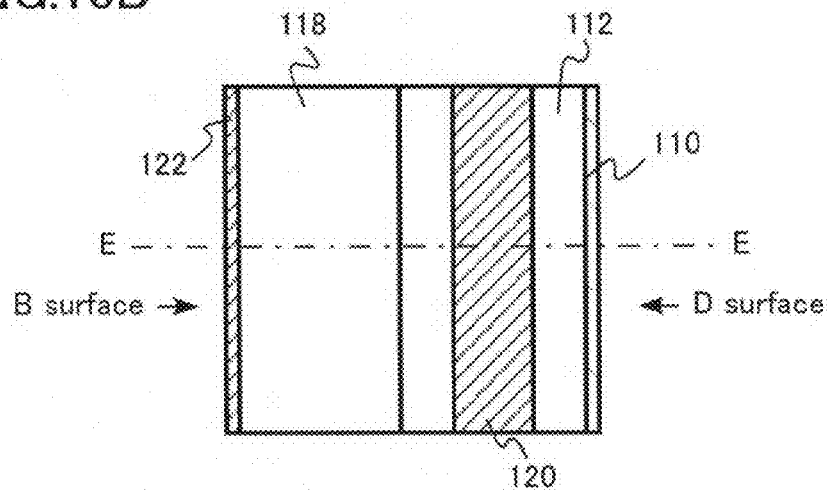
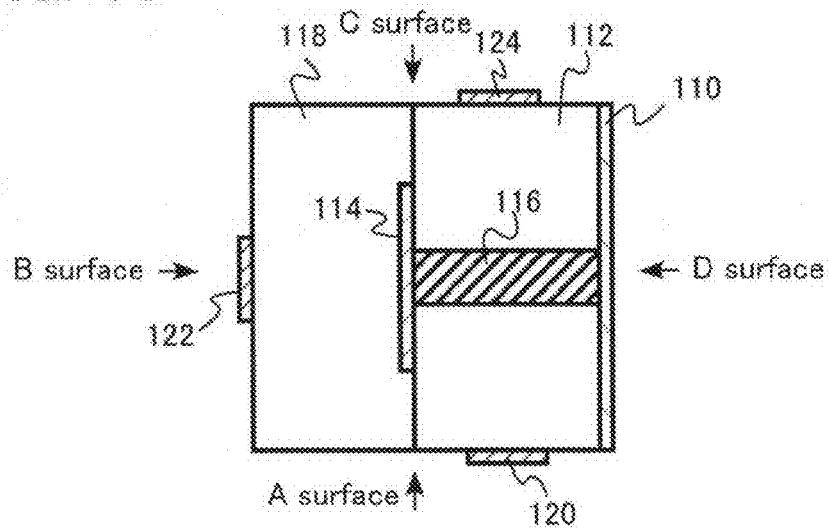

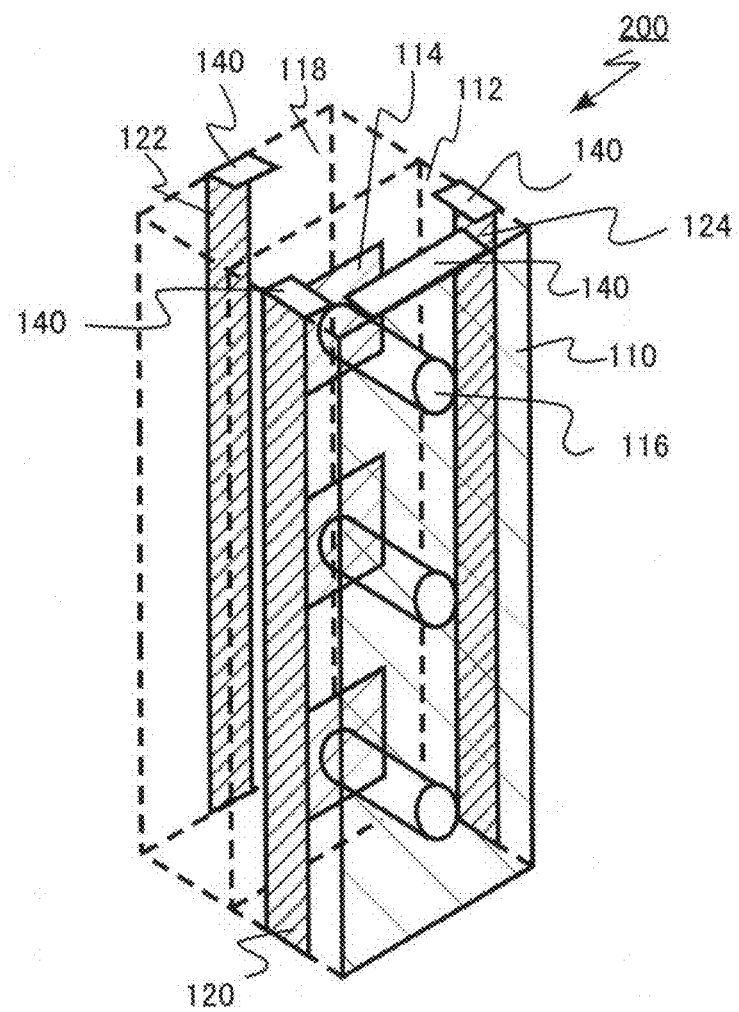

FIG.33A
FIG.33B
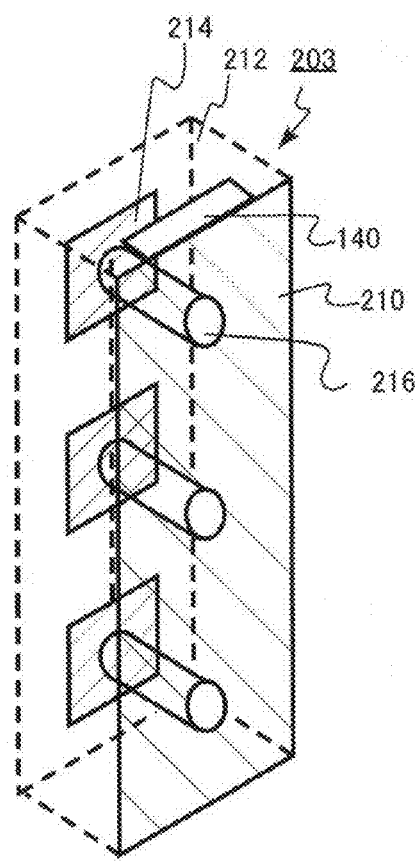
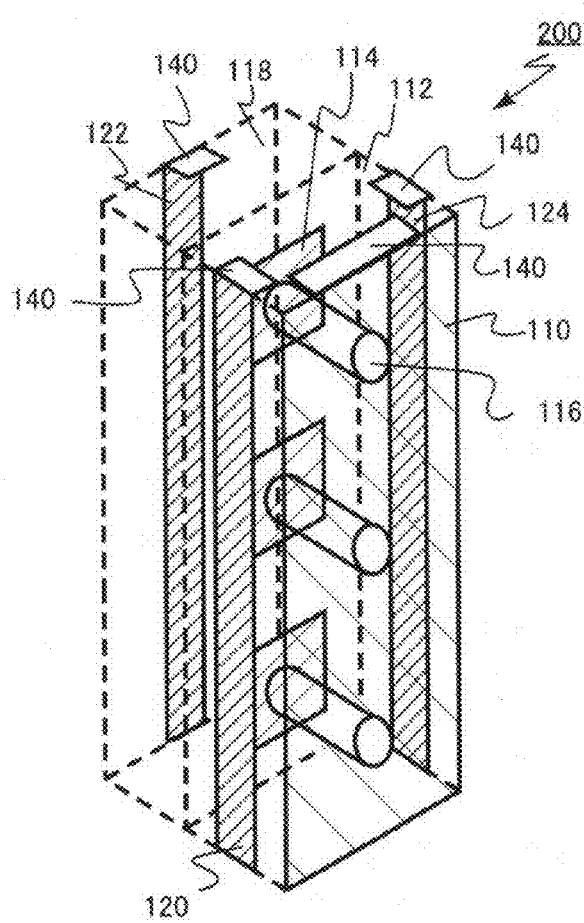

CIRCUIT BOARD SIDE

CIRCUIT BOARD SIDE

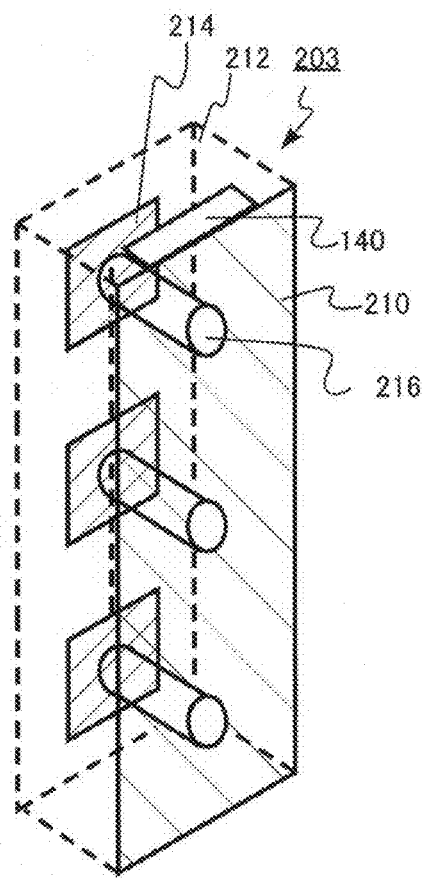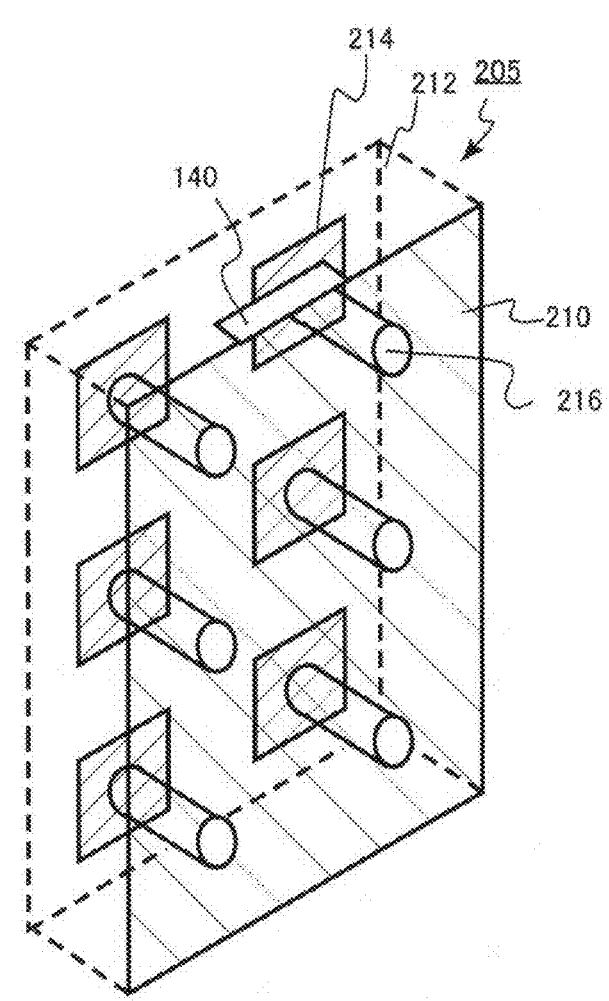

CIRCUIT BOARD SIDE

CONNECTION MEMBER, SEMICONDUCTOR DEVICE, AND STACKED STRUCTURE

CROSS-REFERENCE TO RELATED APPLICATION

This application is based upon and claims the benefit of priority from Japanese Patent Application No. 2013-197853, filed on Sep. 25, 2013, the entire contents of which are incorporated herein by reference.

FIELD

Embodiments described herein relate generally to a connection member, a semiconductor device, and a stacked structure.

BACKGROUND

In a semiconductor device or a circuit board including a high frequency chip such as GaAs for transmitting and receiving a high frequency signal, it is important to have an implementation technique of design that eliminates, as much as possible, degradation factors of signal characteristics such as reflections, noises, and the like in a desired frequency band. However, with the trend of reduction in the size and higher density, devices are arranged closer to each other, and signal lines, a power supply line, and a ground line are arranged closer to each other, and this causes the factor of noise generation. When a semiconductor device and a circuit board are made into three dimension, the electromagnetic field becomes discontinuous in an area of a via which electrically connects an upper layer and a lower layer, and this causes the factor of degradation of the transmission signal.

In order to prevent the signal characteristics from being degraded, for example, multiple filter circuits are formed around the high frequency chip to suppress degradation of the transmission signal. For example, a signal line from an Rf input/output pad of a high frequency chip is connected to a band-pass filter (which may be hereinafter also abbreviated as BPF), and pads corresponding to a power supply, a DC bias, and a ground are connected to low-pass filters (which may be hereinafter also abbreviated as LPFs).

As a matter of fact, there is a problem in that it is difficult to reduce the size of the module in order to form multiple filter circuits.

BRIEF DESCRIPTION OF THE DRAWINGS

FIGS. 3A to 3H are explanatory diagrams illustrating a manufacturing method according to the first embodiment;

FIGS. 13A to 13C are schematic diagrams illustrating the connection member according to the sixth embodiment;

FIG. 29 is a schematic perspective view illustrating a connection member constituting the connection unit block according to the eighth embodiment;

FIGS. 33A, 33B are schematic diagrams illustrating constituent elements of a shielding wall according to the tenth embodiment;

FIGS. 46A, 46B are schematic diagrams illustrating constituent elements of a shielding wall according to a twelfth embodiment;

DETAILED DESCRIPTION

A connection member according to an embodiment includes a dielectric material, a penetrating via penetrating through the dielectric material, a first metal plane provided in the dielectric material, the first metal plane being perpendicular to an extension direction of the penetrating via, the first metal plane crossing the penetrating via, and a second metal plane provided in or on the dielectric material, the second metal plane provided in parallel with the extension direction of the penetrating via, the second metal plane connected to the first metal plane.

In this specification, a "semiconductor device" means not only a semiconductor chip including an SOC (system on chip) but also a concept including, for example, a semiconductor component having multiple semiconductor chips adhered with resin so that the chips are connected with each other by means of wiring layers, which is a so-called pseudo SOC (pseudo system on chip).

In this specification, an "electronic component" is a concept including components in general, which electronically function such as passive semiconductor components and passive components such as an antenna, a capacitor, or a resistor.

In this specification, a "printed wiring board" is a board having conductive printed wires formed thereon, and means a so-called bare board on which no electronic component is implemented.

In this specification, a "circuit board" means one made by implementing electronic components on a printed wiring board.

(First Embodiment)

A connection member according to the present embodiment includes a dielectric material, a penetrating via that penetrates through the dielectric material, a first metal plane which is provided in the dielectric material so as to be perpendicular to an extension direction of the penetrating via and which crosses the penetrating via, and a second metal plane provided in or on the dielectric material, the second metal plane which is provided in parallel with the extension direction of the penetrating via and which is connected to the first metal plane.

The connection member according to the present embodiment can be used as a member for electrically connecting upper and lower wiring layers in the pseudo SOC, for example. For example, in a stacked structure including multiple stacked circuit boards, the connection member according to the present embodiment can be used as a member for electrically connecting wiring layers of the upper and lower circuit boards.

Figure 1A:
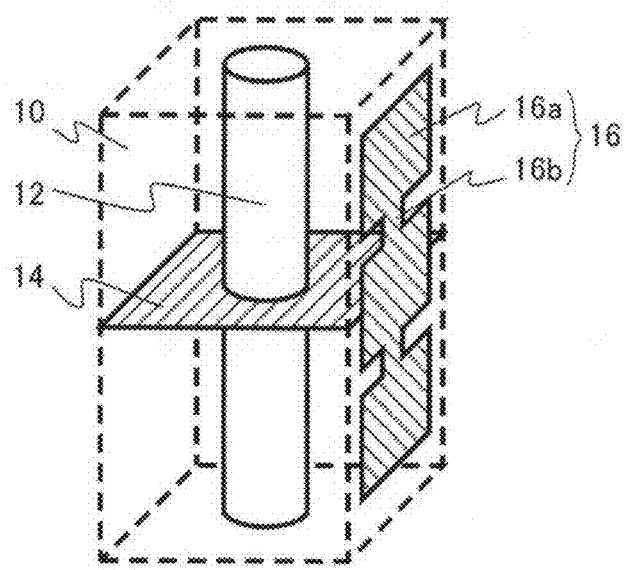
FIGS. 1A to 1C are schematic diagrams illustrating a connection member according to a first embodiment.
Figure 1B:
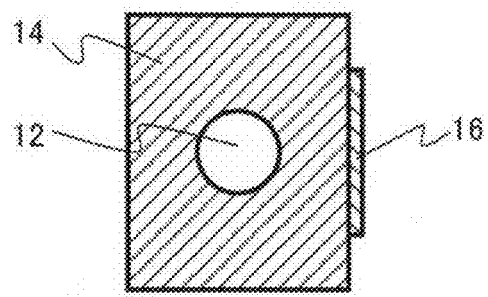
Figure 1C:
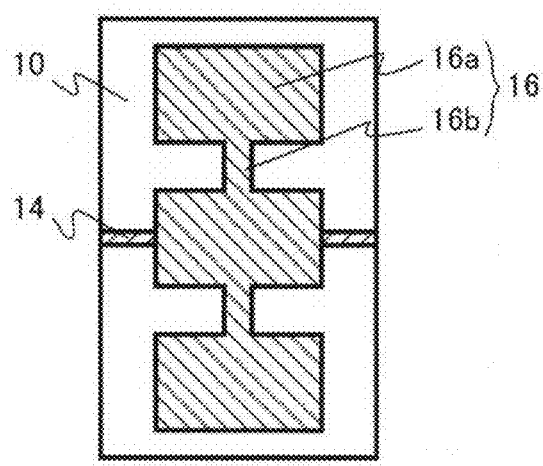

FIGS. 1A to 1C are schematic diagrams illustrating the connection member according to the present embodiment. FIG. 1A is a schematic perspective view. FIG. 1B is a cross sectional view illustrating an intermediate portion. FIG. 1C is a side view.

The connection member according to the present embodiment includes a dielectric material 10, a penetrating via 12 that penetrates the dielectric material 10, a first metal plane 14, and a second metal plane 16. The first metal plane 14 is provided in the dielectric material 10 so as to be perpendicular to the extension direction of the penetrating via 12, and crosses the penetrating via 12. The second metal plane 16 is provided in parallel with the extension direction of the penetrating via 12, and is connected to the first metal plane 14.

The dielectric material 10 is, for example, resin. The dielectric material may be, for example, filler-filled resin which has epoxy resin and the like filled with filler such as silica. For example, it may be possible to use highly filled resin of which filling factor of filler is 80 wt. % or more. For example, a portion around the penetrating via 12 may be made of lowly filled resin of which filling factor of filler is less than 50 wt. %. Accordingly, the side wall surface of the penetrating via 12 becomes smooth, and the reliability of the connection member improves.

The dielectric material 10 may be made of a material other than resin as long as it is a substance of which resistance is more than that of the penetrating via 12 and of which dielectric property is higher than the conductive property thereof. For example, high resistance silicon, ceramics, and the like can be used.

The penetrating via 12 penetrates the dielectric material 10 from the upper portion to the lower portion, and is made of a conductive material. The conductive material may be, for example, metal such as aluminum (Al), Cu (copper), or gold (Au). Alternatively, a material filled with solder member or conductive paste.

The first metal plane 14 is provided in the dielectric material 10 so as to be perpendicular to the extension direction of the penetrating via 12, and crosses the penetrating via 12. The first metal plane 14 is connected with the penetrating via 12. The first metal plane 14 may be, for example, metal such as aluminum (Al), Cu (copper), or gold (Au). Alternatively, it may be a plane made of solder member or conductive paste.

Hereinafter, a metal pattern provided perpendicular to the extension direction of the penetrating via 12, for example, the first metal plane 14, will be referred to as a metal pattern A. In the present embodiment, the metal pattern A is in a rectangular shape.

The second metal plane 16 is provided in or on the dielectric material 10 so as to be in parallel with the extension direction of the penetrating via 12, and is connected to the first metal plane 14. The second metal plane 16 is, for example, metal such as aluminum (Al), Cu (copper), or gold (Au). Alternatively, it may be a plane made of solder member or conductive paste.

Hereinafter, a metal pattern provided in parallel with the extension direction of the penetrating via 12, for example, the second metal plane 16, will be referred to as a metal pattern B. In the present embodiment, the metal pattern B, which is the second metal plane 16, includes multiple wide portions 16*a* and narrow portions 16*b* connecting the wide portions 16*a*.

Figure 2:
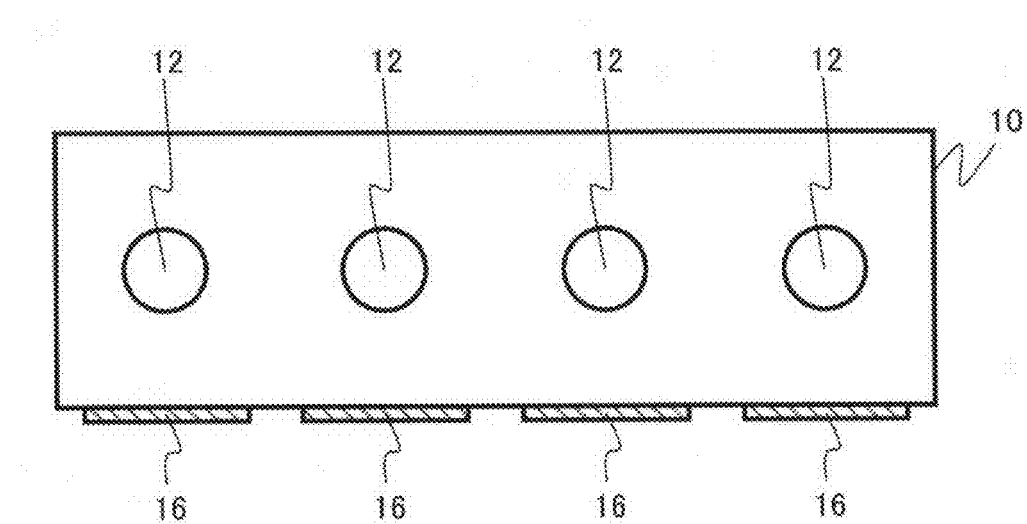
FIG. 2 is a schematic diagram illustrating a modification of the connection member according to the first embodiment.

FIG. 2 is a schematic diagram illustrating a modification of the connection member according to the present embodiment. As shown in FIG. 2, multiple penetrating vias 12 and multiple second metal planes 16 may be arranged in parallel.

Subsequently, a manufacturing method according to the present embodiment will be explained. FIGS. 3A to 3H are explanatory diagrams illustrating a manufacturing method according to the present embodiment.

First, for example, an acrylic-based adhesive sheet attached to a glass substrate of which thickness is 0.8 mm (not shown) is prepared. A highly filled resin 20 which is made by, for example, adding silica filler to epoxy resin of acid anhydride-based curing agent at 85 wt. % is printed on the adhesive sheet, and, for example, it is pre-calcinated at 100° C., and thereafter, the adhesive sheet is released, so that the highly filled resin substrate 20 is obtained (FIG. 3A).

This resin substrate 20 is processed into multiple recessed lines 22 (FIG. 3B). Then, the entire resin substrate is coated with, for example, epoxy resin having no filler added thereto, so that it is thinly coated (not shown).

Subsequently, the recessed lines 22 of the resin substrate 20 are filled with, for example, Ag paste 24 (FIG. 3C). Subsequently, after the calcination, the highly filled resin 26 is printed and calcinated (FIG. 3D).

This resin substrate 20 is pasted to the adhesive sheet 30 again, and a desired position is removed by dicing (FIG. 3E). This removed area 32 is filled with, for example, Ag paste and calcinated, so that a metal pattern A is formed (FIG. 3F). Thereafter, the adhesive sheet 30 is released.

Ag paste is printed on the resin substrate 20 and calcinated, so that the metal patterns B are formed (FIG. 3G). Thereafter, the resin substrate 20 is separated into pieces, so that connection members are obtained (FIG. 3H).

In the connection member according to the present embodiment, the impedance is controlled by the metal pattern A and the metal pattern B arranged perpendicular to each other and connected to the penetrating via 12. The connection member according to the present embodiment functions as a low-pass filter (LPF) with the metal pattern A and the metal pattern B.

Therefore, according to the present embodiment, the degradation of the transmission signal by the penetrating via 12 is suppressed. When the wiring layers are connected using the connection member according to the present embodiment, for example, it is not necessary to additionally provide a band-pass filter in the electronic circuit.

When the patterns of the metal pattern A and the metal pattern B are changed, a connection member having a filter function of desired characteristics can be achieved.

(Second Embodiment)

A connection member according to the present embodiment is different from the first embodiment in that the connection member according to the present embodiment further includes a third metal plane which is provided in the dielectric material so as to be perpendicular to the extension direction of the penetrating via, and which crosses the penetrating via and connected to the second metal plane. In the explanation below, description about the same contents as those of the first embodiment will be omitted.

Figure 4A:
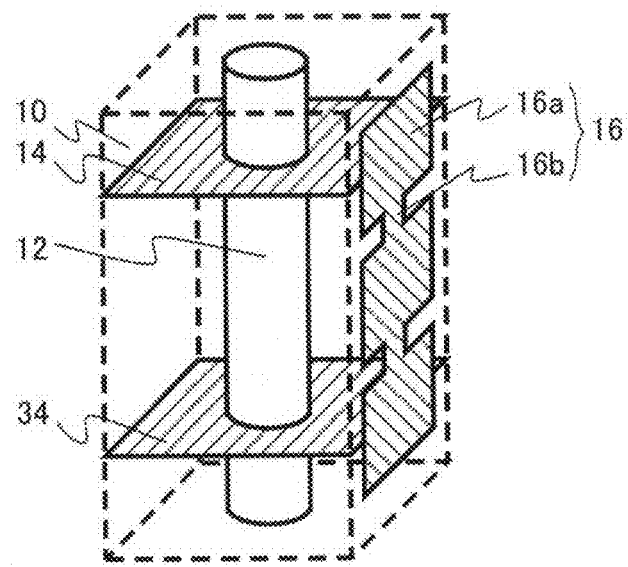
FIGS. 4A to 4C are schematic diagrams illustrating a connection member according to a second embodiment.
Figure 4B:
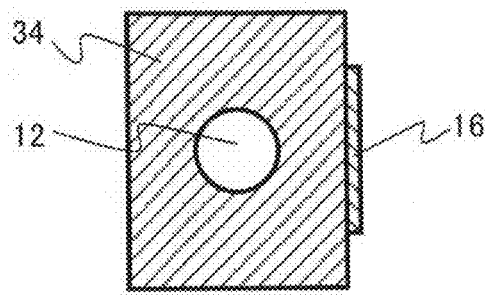
Figure 4C:
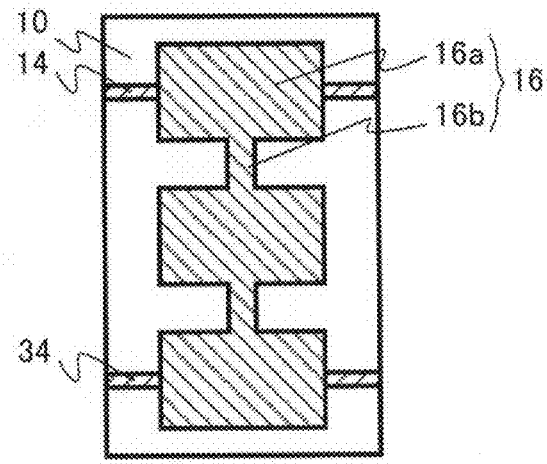

FIGS. 4A to 4C are schematic diagrams illustrating the connection member according to the present embodiment. FIG. 4A is a schematic perspective view. FIG. 4B is a cross sectional view illustrating an intermediate portion. FIG. 4C is a side view.

The connection member according to the present Embodiment includes a dielectric material 10, a penetrating via 12 that penetrates the dielectric material 10, a first metal plane 14, and a second metal plane 16. The first metal plane 14 is provided in the dielectric material 10 so as to be perpendicular to the extension direction of the penetrating via 12, and crosses the penetrating via 12. The second metal plane 16 is provided in parallel with the extension direction of the penetrating via 12, and is connected to the first metal plane 14. Further, a third metal plane 34 is provided in the dielectric material 10 so as to be perpendicular to the extension direction of the penetrating via 12, and cross the penetrating via 12 and is in contact with the second metal plane 16.

In the present embodiment, the metal pattern A is constituted by the first metal plane 14 and the third metal plane 34. The metal pattern B is constituted by the second metal plane 16. The connection member according to the present embodiment functions as a band-pass filter (BPF) according to the above configuration.

(Third Embodiment)

The connection member according to the present embodiment is different from the first embodiment in that the connection member according to the present embodiment further includes a third metal plane which is provided parallel to the extension direction of the penetrating via and which is connected to the first metal plane and facing the second metal plane with the penetrating via interposed therebetween, a fourth metal plane provided in the dielectric material so as to be perpendicular to the extension direction of the penetrating via and cross the penetrating via, a fifth metal plane which is provided in parallel with the extension direction of the penetrating via and which is connected to the fourth metal plane, and a sixth metal plane which is provided in parallel with the extension direction of the penetrating via and which is connected to the fourth metal plane and faces the fifth metal plane with the penetrating via interposed therebetween. In the explanation below, description about the same contents as those of the first embodiment will be omitted.

Figure 5A:
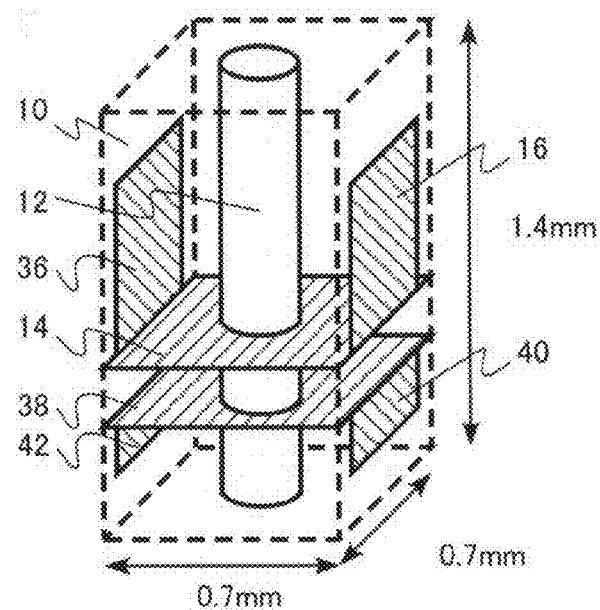
FIGS. 5A to 5C are schematic diagrams illustrating a connection member according to a third embodiment.
Figure 5B:
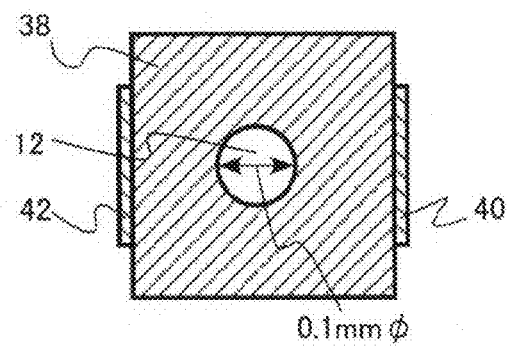
Figure 5C:
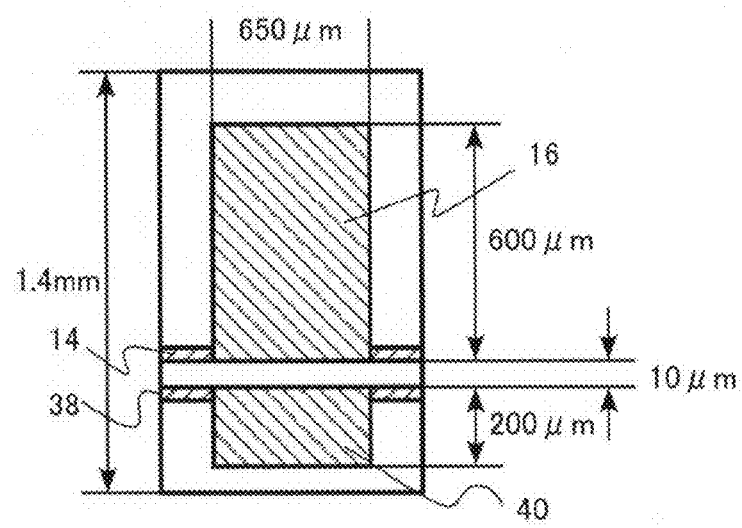

FIGS. 5A to 5C are schematic diagrams illustrating the connection member according to the present embodiment. FIG. 5A is a schematic perspective view. FIG. 5B is a cross sectional view illustrating an intermediate portion. FIG. 5C is a side view.

The connection member according to the present embodiment includes a dielectric material 10, a penetrating via 12 that penetrates the dielectric material 10, a first metal plane 14, and a second metal plane 16. The first metal plane 14 is provided in the dielectric material 10 so as to be perpendicular to the extension direction of the penetrating via 12, and crosses the penetrating via 12. The second metal plane 16 is provided in parallel with the extension direction of the penetrating via 12, and is connected to the first metal plane 14. Further, the connection member according to the present embodiment further includes a third metal plane 36 which is provided parallel to the extension direction of the penetrating via 12 and which is connected to the first metal plane 14 and facing the second metal plane 16 with the penetrating via 12 interposed therebetween, a fourth metal plane 38 provided in the dielectric material 10 so as to be perpendicular to the extension direction of the penetrating via 12 and cross the penetrating via 12, a fifth metal plane 40 which is provided in parallel with the extension direction of the penetrating via 12 and which is connected to the fourth metal plane 38, and a sixth metal plane 42 which is provided in parallel with the extension direction of the penetrating via 12 and which is connected to the fourth metal plane 38 and faces the fifth metal plane 40 with the penetrating via 12 interposed therebetween.

In the present embodiment, the metal pattern A is constituted by the first metal plane 14 and the fourth metal plane 38. The metal pattern B is constituted by the second metal plane 16, the third metal plane 36, the fifth metal plane 40, and the sixth metal plane 42. The connection member according to the present embodiment functions as a band-pass filter (BPF) according to the above configuration.

Figure 6:
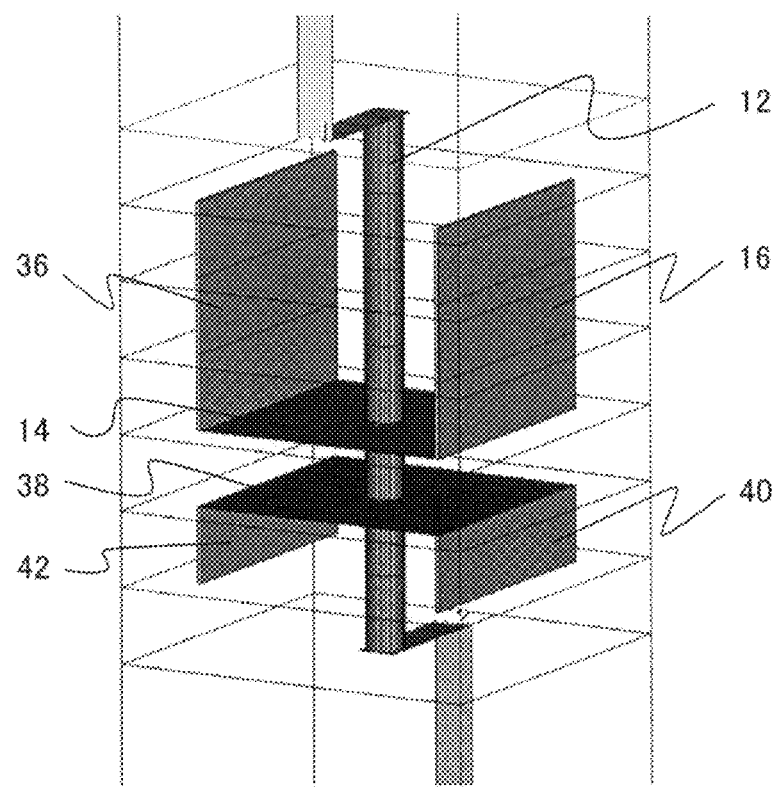
FIG. 6 is a schematic diagram illustrating a structure used for electromagnetic field analysis according to the third embodiment.

FIG. 6 is a schematic diagram illustrating a structure used for the electromagnetic field analysis according to the present embodiment. The dimension of each constituent element as shown in FIG. 5 is applied to a model structure of FIG. 6, and the electromagnetic field analysis is performed.

Figure 7:
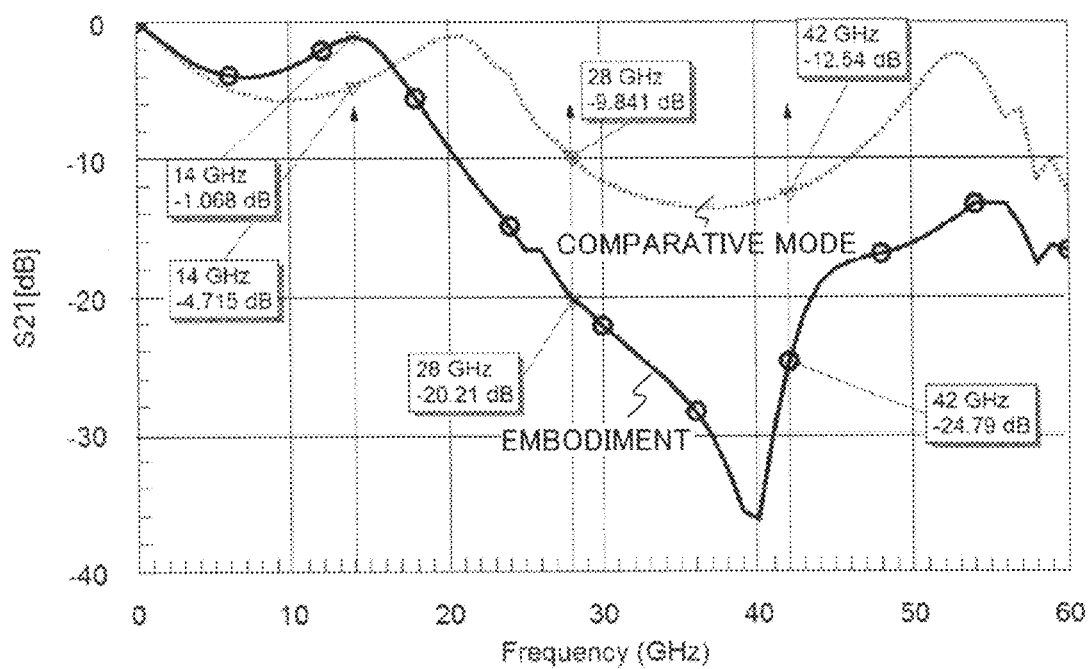
FIG. 7 is a figure illustrating a result of the electromagnetic field analysis according to the third embodiment.

FIG. 7 is a figure illustrating a result of the electromagnetic field analysis according to the present embodiment, and is a figure illustrating pass characteristics (S21) of the connection member. The pass characteristics (S21) are derived from the electromagnetic field analysis. For comparison, the electromagnetic field analysis is performed for a structure having neither metal pattern A nor metal pattern B as a comparative mode, that is, for a structure having only the penetrating via, and thus the pass characteristics are derived.

As shown in FIG. 7, when the carrier wave is 14 GHz, low loss can be realized according to the present embodiment. At 28 GHz which is the second harmonic of the carrier wave and 42 GHz which is the third harmonic thereof, superior cut off effect can be confirmed according to the embodiment.

(Fourth Embodiment)

A semiconductor device according to the present embodiment includes a connection member including a dielectric material, a penetrating via that penetrates through the dielectric material, a first metal plane which is provided in the dielectric material so as to be perpendicular to an extension direction of the penetrating via and which crosses the penetrating via, and a second metal plane which is provided in parallel with the extension direction of the penetrating via and which is connected to the first metal plane. The semiconductor device according to the present embodiment includes multiple semiconductor chips including a high frequency chip, a resin layer configured to adhere the multiple semiconductor chips and the connection member with each other, and a wiring layer formed on the multiple semiconductor chips and the connection member and configured to electrically connecting the multiple semiconductor chips and the connection member. The semiconductor device according to the present embodiment is a pseudo SOC.

The connection member according to the present embodiment is the same as the connection member according to the first to the third embodiments. Therefore, description about the same contents as those of the first to third embodiments will be omitted.

Figure 8:
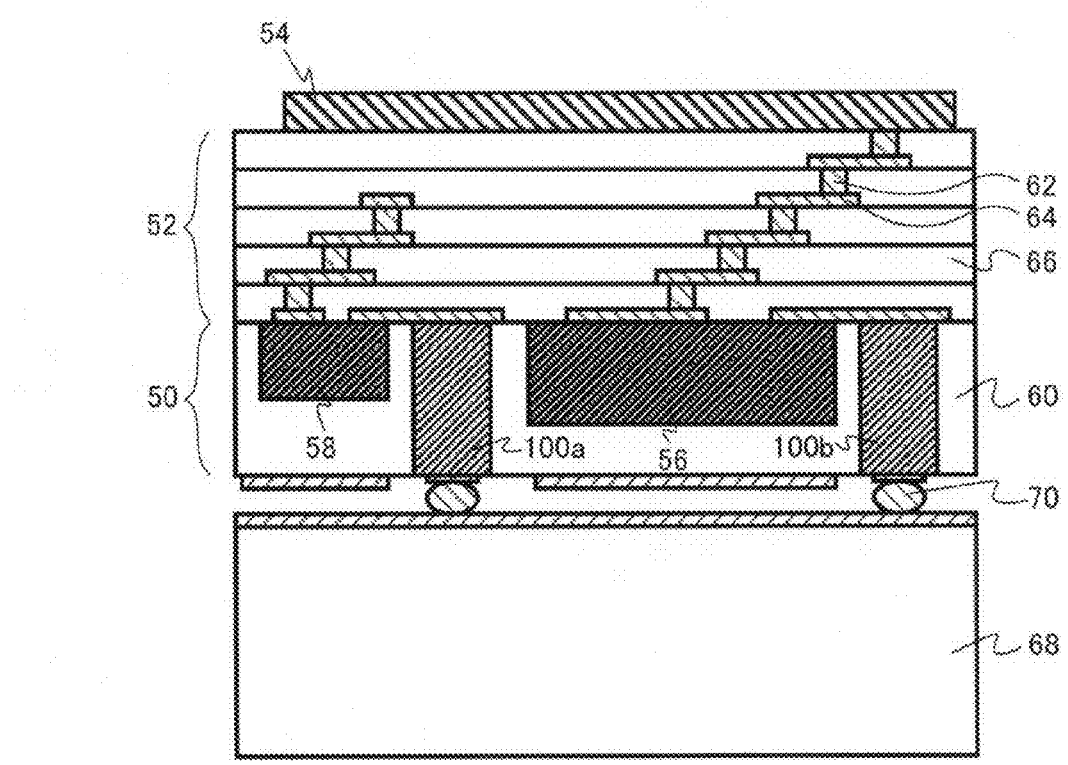
FIG. 8 is a schematic cross sectional view illustrating a semiconductor device according to a fourth embodiment.

FIG. 8 is a schematic cross sectional view illustrating the semiconductor device according to the present embodiment. The semiconductor device includes a reconfiguration substrate 50, a rewiring layer (wiring layer) 52 on the reconfiguration substrate, and an antenna 54 on the rewiring layer 52. The semiconductor device according to the present embodiment is three-dimensional semiconductor module.

The reconfiguration substrate 50 includes a high frequency chip 56 and a control chip 58. The control chip 58 is an example of semiconductor chip. Further, the reconfiguration substrate 50 includes connection members 100a, 100b. The high frequency chip 56, the control chip 58, and the connection members 100a, 100b are connected with each other by a resin layer 60.

The rewiring layer 52 has a multi-layer structure including a wiring line 64, an insulation layer 66, and a via 62.

The connection members 100a, 100b are, for example, the connection member according to the first to the third embodiments.

The semiconductor device according to the present embodiment is implemented on a printed wiring board 68 by connection bumps 70 provided on the printed wiring board 68.

In the explanation below, a manufacturing method of the semiconductor device according to the present embodiment will be explained. FIGS. 9A to 9D are explanatory diagrams illustrating a manufacturing method of the semiconductor device according to the present embodiment.

Figure 9A:
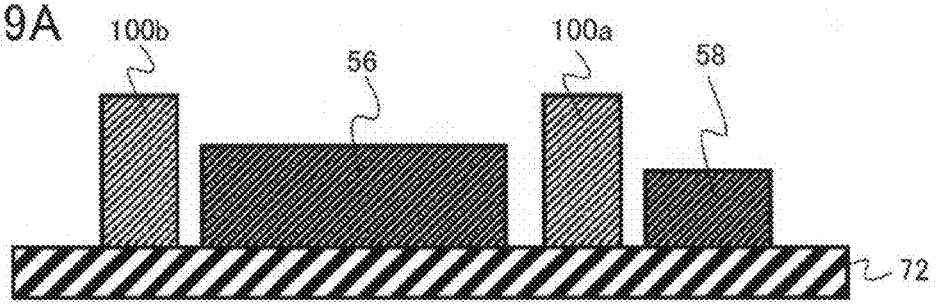
FIGS. 9A to 9D are explanatory diagrams illustrating a manufacturing method of the semiconductor device according to the fourth embodiment.
Figure 9B:
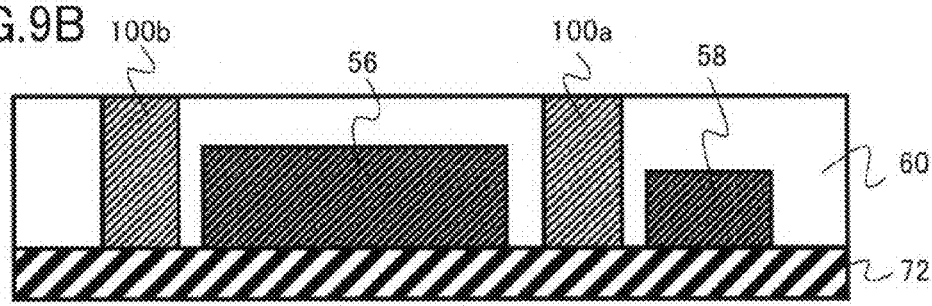

First, for example, an acrylic-based adhesive sheet 72 pasted on a glass substrate (not shown) of which thickness is 0.8 mm is prepared. The high frequency chip 56, the control chip 58, and the connection members 100a, 100b are implemented on the adhesive sheet 72 (FIG. 9A). Subsequently, a highly filled resin 60 which is made by, for example, adding silica filler to epoxy resin of acid anhydride-based curing agent at 85 wt. % is printed on the adhesive sheet, and, for example, it is pre-calcinated at 100° C. (FIG. 9B).

Figure 9C:
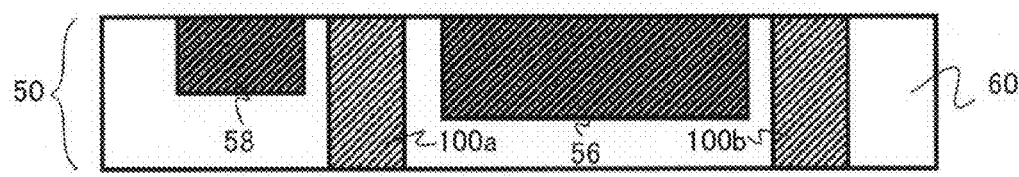
Figure 9D:
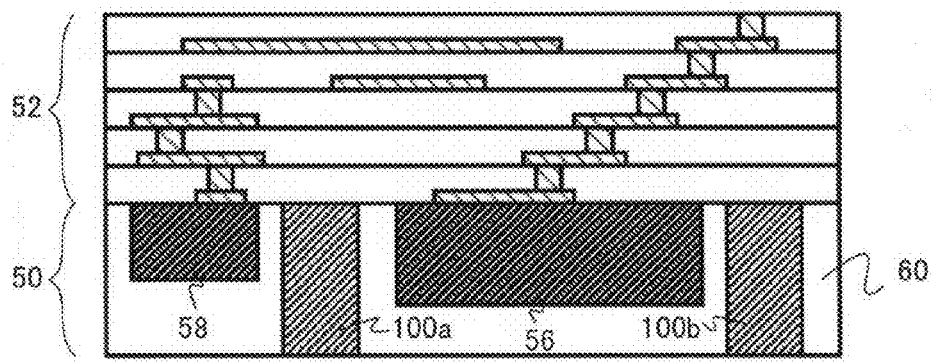

Thereafter, the adhesive sheet 72 is released, so that the reconfiguration substrate 50 is obtained (FIG. 9C). On the reconfiguration substrate 50, for example, a photosensitive polyimide layer is formed, and a through-hole is formed at a desired position. After an aluminum layer is formed, patterning is made by photolithography, and aluminum fine wiring lines and vias are formed. The wiring line is formed according to the same process. Thus, the rewiring layer 52 is formed (FIG. 9D).

Thereafter, the antenna 54 of the aluminum layer is patterned and formed on the uppermost layer. The wiring layer is formed on the back surface of the reconfiguration substrate 50 according to the same process, and the semiconductor device as shown in FIG. 8 is made. Thereafter, the semiconductor device is implemented on the printed wiring board 68 having the connection bumps 70 formed thereon in advance, so that the structure as shown in FIG. 8 is obtained.

Figure 10:
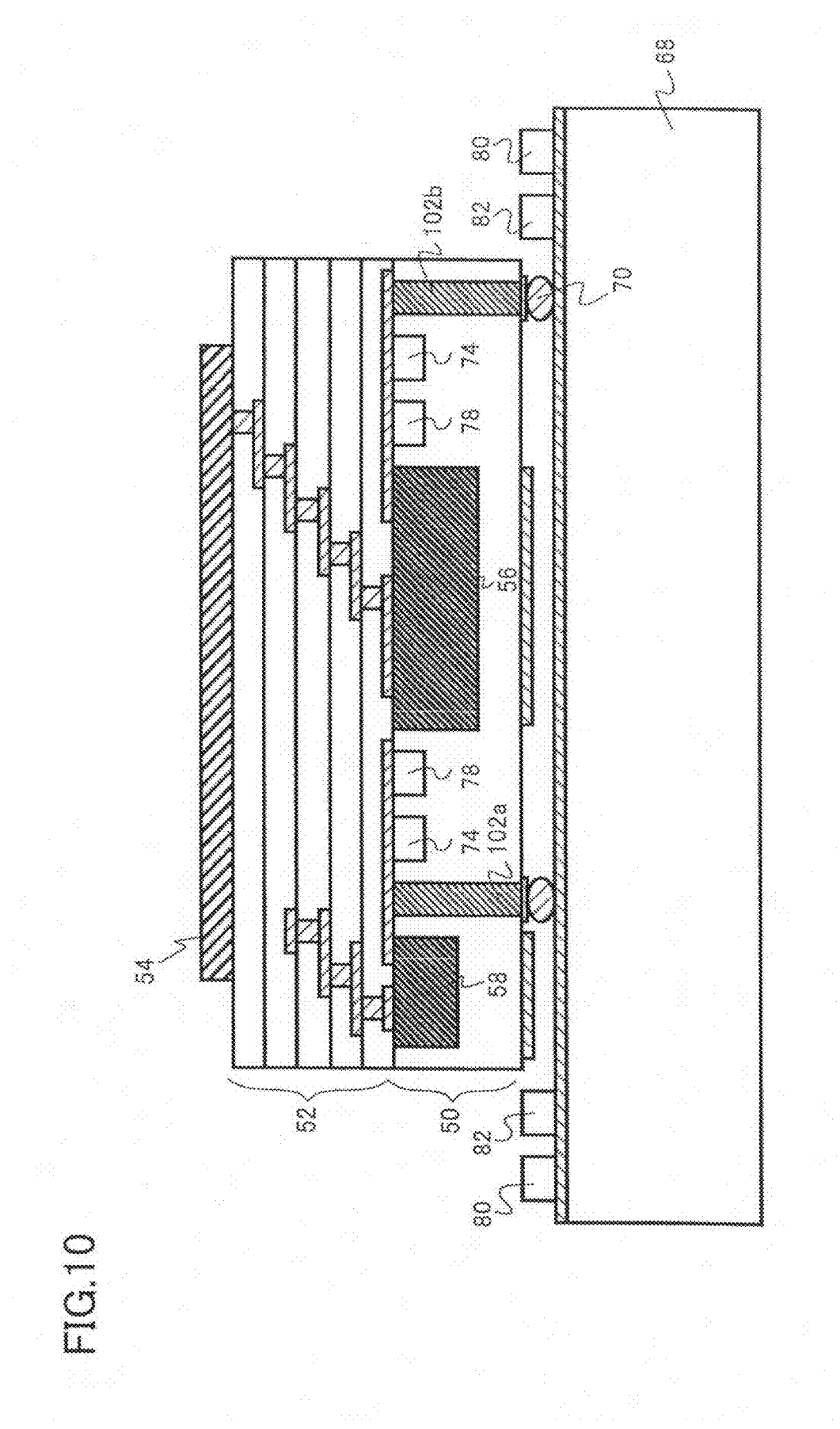
FIG. 10 is a schematic cross sectional view illustrating the semiconductor device according to the comparative mode.

FIG. 10 is a schematic cross sectional view illustrating the semiconductor device according to the comparative mode. Unlike the present embodiment, no connection member is used.

Like the present embodiment, the semiconductor device according to the comparative mode includes a reconfiguration substrate 50, a rewiring layer (wiring layer) 52 on the reconfiguration substrate, and an antenna 54 on the rewiring layer 52. However, instead of the connection members 100a, 100b, penetrating vias 102a, 102b having no filter function are provided.

The semiconductor device according to the comparative mode includes not only the high frequency chip 56 and the control chip 58 but also, for example, a low-pass filter 74 and a band-pass filter 78, for adjusting a signal which is output from the high frequency chip 56.

In the present embodiment, for example, the connection members 100a, 100b have the functions of the low-pass filter 74 and the band-pass filter 78 according to the comparative mode. Therefore, as compared with the comparative mode, the size of the semiconductor device can be reduced. In order to achieve the same performance, the semiconductor device of the embodiment can be reduced to a size of 24.3% of the size of the semiconductor device according to the comparative mode.

When the semiconductor device according to the comparative mode is implemented on the printed wiring board 68, for example, the low-pass filter 80 and the band-pass filter 82 are implemented for adjusting a signal which is output from the semiconductor device.

In the present embodiment, for example, the connection members 100a, 100b have the functions of the low-pass filter 80 and the band-pass filter 82 according to the comparative mode. Therefore, as compared with the comparative mode, the size of the circuit board on which the semiconductor device is implemented can be reduced. In order to achieve the same performance, the size of the circuit board on which the semiconductor device according to the embodiment is implemented can be reduced to a size of 15.3% of the circuit board on which the semiconductor device according to the comparative mode is implemented.

According to the present embodiment explained above, the connection member has the filter function; therefore, the sizes of the semiconductor device and the circuit board can be reduced.

(Fifth Embodiment)

A stacked structure according to the present embodiment includes a connection member including a dielectric material, a penetrating via that penetrates through the dielectric material, a first metal plane which is provided in the dielectric material so as to be perpendicular to an extension direction of the penetrating via and which crosses the penetrating via, and a second metal plane which is provided in parallel with the extension direction of the penetrating via and which is connected to the first metal plane, and also includes a first circuit board.

The connection member according to the present embodiment is the same as the connection member according to the first to the third embodiments. Therefore, description about the same contents as those of the first to third embodiments will be omitted.

Figure 11:
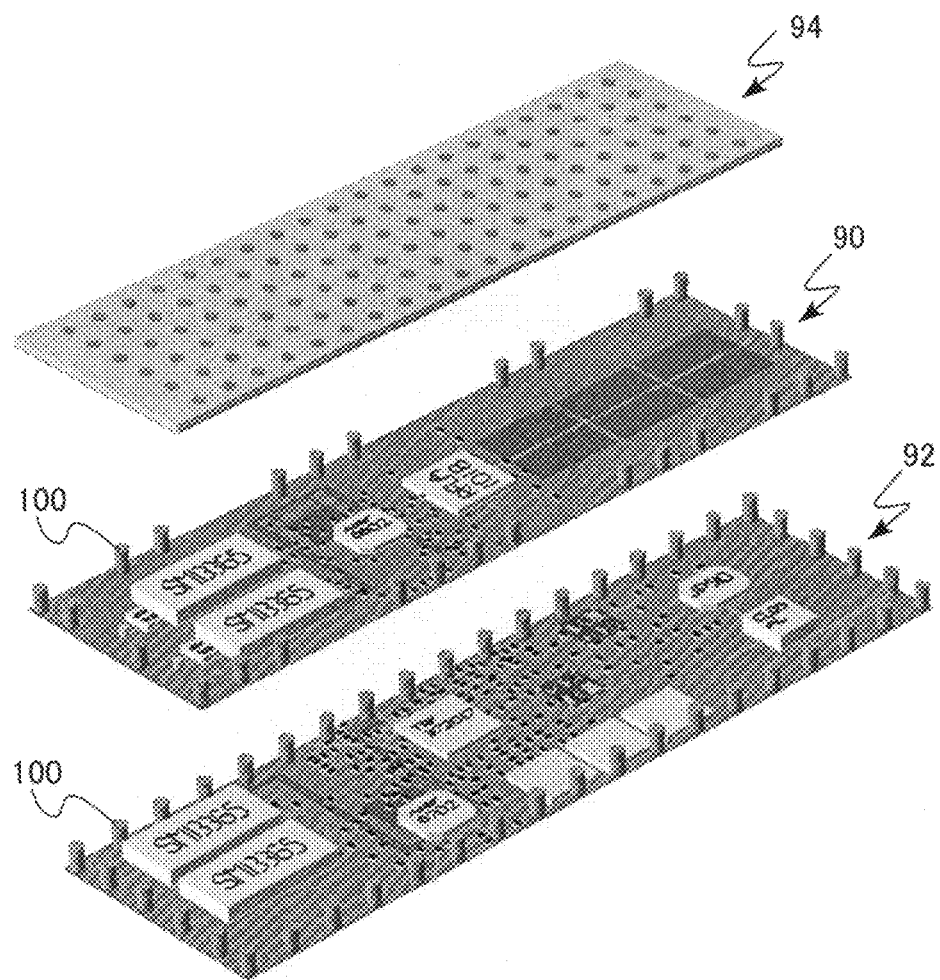
FIG. 11 is a schematic diagram illustrating a stacked structure according to a fifth embodiment.

FIG. 11 is a schematic diagram illustrating the stacked structure according to the present embodiment. The stacked structure according to the present embodiment includes a first circuit board 90, a second circuit board 92, and an EBG (Electromagnetic Band Gap) structure body 94. The stacked structure according to the present embodiment is a stacked-type circuit board for high frequency.

The second circuit board 92 is provided below the first circuit board 90. The first circuit board 90 and the second circuit board 92 are stacked. Multiple connection members 100 are provided between the first circuit board 90 and the second circuit board 92. The first circuit board 90 and the second circuit board 92 are electrically connected by the multiple connection members 100. The multiple connection members 100 also function as spacers between the first circuit board 90 and the second circuit board 92.

The EBG structure body 94 is provided above the first circuit board 90. The first circuit board 90 and the EBG structure body 94 are stacked. Multiple connection members 100 are provided between the first circuit board 90 and the EBG structure body 94. The first circuit board 90 and the EBG structure body 94 are electrically connected by the multiple connection members 100. The multiple connection members 100 also function as spacers between the first circuit board 90 and the EBG structure body 94.

According to the present embodiment, the multiple connection members 100 having the filter function are used; therefore, the number of components for the filter circuit of the stacked structure can be reduced. Therefore, the size of the stacked structure can be reduced. Since the EBG structure body 94 is connected by the multiple connection members 100, the ground potential and the power supply voltage are stabilized. Therefore, the stacked structure of which size is small and of which characteristics are stable can be realized.

(Sixth Embodiment)

The connection member according to the present embodiment includes a metal plane, a first dielectric material covering the metal plane, a metal patch formed with the first dielectric material interposed between the metal patch and the metal plane, a connection via provided in the first dielectric material and connecting the metal plane and the metal patch, and a first signal line formed to be in contact with the first dielectric material or the second dielectric material and extending in a direction perpendicular to the extension direction of the connection via.

Further, the connection member according to the present embodiment includes a second dielectric material covering the metal patch. The first signal line is formed to be in contact with the first dielectric material or the second dielectric material. In addition, the connection member according to the present embodiment further includes a second signal line and a third signal line extending in a direction perpendicular to the connection via. The first signal line is formed with the first dielectric material interposed between the first signal line and the connection via. The second signal line is formed with the second dielectric material interposed between the second signal line and the metal patch. The third signal line is formed with the connection via and the first dielectric material which are interposed between the third signal line and the first signal line.

The connection member according to the present embodiment can be used as a member for electrically connecting upper and lower wiring layers in the pseudo SOC, for example. For example, in a stacked structure including multiple stacked circuit boards, the connection member according to the present embodiment can be used as a member for electrically connecting wiring layers of the upper and lower circuit boards.

Figure 12:
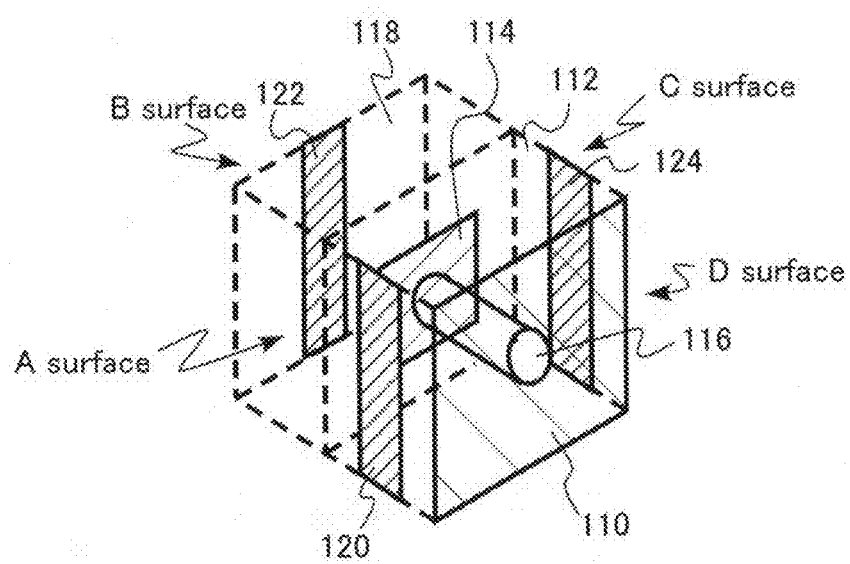
FIG. 12 is a schematic perspective view illustrating a connection member according to a sixth embodiment.

FIG. 12 is a schematic perspective view illustrating the connection member according to the present embodiment. FIGS. 13A to 13C are schematic diagrams illustrating the connection member according to the present embodiment. FIG. 13A is a schematic top view. FIG. 13B is a schematic side view. FIG. 13C is a schematic cross sectional view illustrating an EE portion of FIG. 13B.

The connection member according to the present embodiment includes a metal plane 110, a first dielectric material 112 covering the metal plane 110, a metal patch 114 formed with the first dielectric material 112 interposed between the metal patch 114 and the metal plane 110, and a connection via 116 connecting the metal plane 110 and the metal patch 114. Further, a second dielectric material 118 covering the metal patch 114 is formed. In addition, a first signal line (signal line A) 120, a second signal line (signal line B) 122, and a third signal line (signal line C) 124 formed to be in contact with the first dielectric material 112 or the second dielectric material 118 are provided.

The metal plane 110 is formed with a metal in a flat plate shape. The metal plane 110 is, for example, metal such as aluminum (Al), Cu (copper), or gold (Au). Alternatively, it may be a plane made of solder member or conductive paste. The metal plane 110 is used while it is fixed at the ground potential.

The first dielectric material 112 is formed on the metal plane 110. The first dielectric material 112 is resin such as epoxy resin. The first dielectric material 112 may be a material other than resin. For example, high resistance silicon, ceramics, and the like can be used.

The metal patch 114 is provided on the first dielectric material 112 so as to be in parallel with the metal plane 110. The metal patch 114 is, for example, metal such as aluminum (Al), Cu (copper), or gold (Au). Alternatively, it may be a plane made of solder member or conductive paste. The metal patch 114 is in, for example, a rectangular shape.

The connection via 116 penetrates the first dielectric material 112, and connects the metal plane 110 and the metal patch 114. The connection via 116 is, for example, metal such as aluminum (Al), Cu (copper), or gold (Au). Alternatively, a material filled with solder member or conductive paste.

The metal plane 110, the metal patch 114, and the connection via 116 form a mushroom-type EBG structure.

The second dielectric material 118 is formed on the metal patch 114. The second dielectric material 118 is resin such as epoxy resin. The second dielectric material 118 may be a material other than resin. For example, high resistance silicon, ceramics, and the like can be used. It should be noted that the materials of the first dielectric material 112 and the second dielectric material 118 may be the same or may be different.

The first signal line 120 is formed with the first dielectric material 112 interposed between the first signal line 120 and the connection via 116. The second signal line 122 is formed with the second dielectric material 118 interposed between the second signal line 122 and the metal patch 114. The third signal line 124 is formed with the connection via 116 and the first dielectric material 112 which are interposed between the third signal line 124 and the first signal line 120. The first signal line 120, the second signal line 122, and the third signal line 124 extend in the same direction.

The first signal line 120, the second signal line 122, and the third signal line 124 are, for example, metal such as aluminum (Al), Cu (copper), or gold (Au). Alternatively, it may be a plane made of solder member or conductive paste.

Hereinafter, for the sake of convenience, the external surfaces of the connection member will be referred to as follows. A surface having the first signal line 120 formed thereon will be referred to as a surface A. A surface having the second signal line 122 formed thereon will be referred to as a surface B. A surface having the third signal line 124 formed thereon will be referred to as a surface C. A surface having the metal plane 110 formed thereon will be referred to as a surface D.

Figure 14:
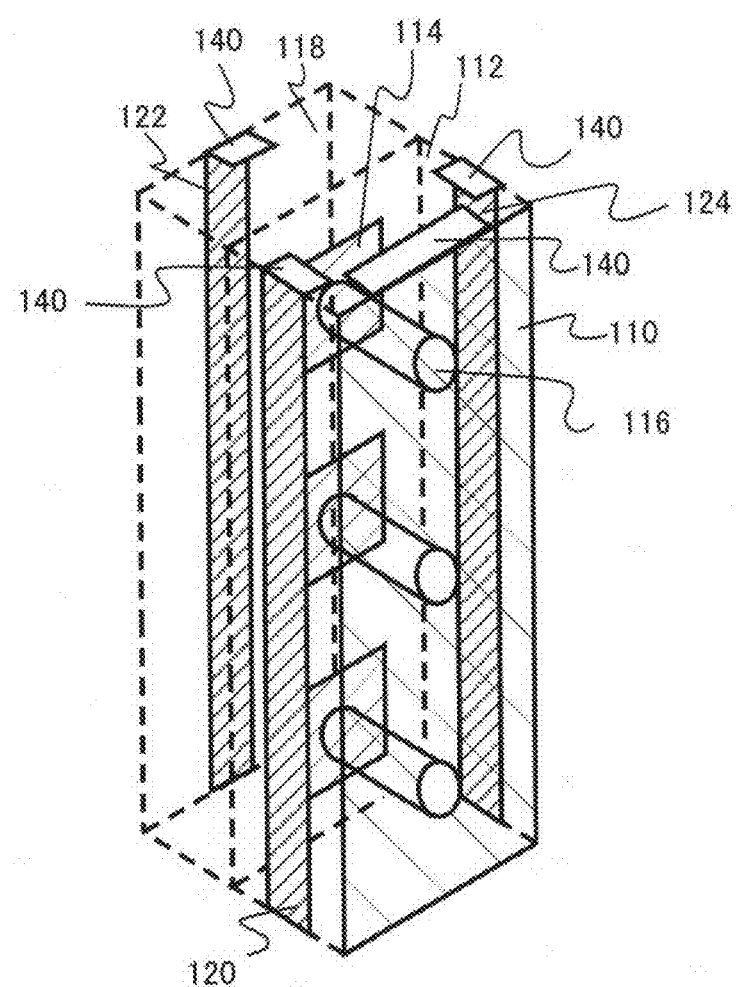
FIG. 14 is a schematic diagram illustrating a modification of the connection member according to the sixth embodiment.

FIG. 14 is a schematic diagram illustrating a modification of the connection member according to the present embodiment. This is a structure made by stacking the structure of FIG. 12 three times. In the connection member according to the modification, cream solder layers 140 are formed on the upper and lower surfaces of the connection member to serve as the electrode terminals. The cream solder layers 140 are connected to the metal plane 110, and the first, the second, and the third signal lines 120, 122, 124.

Subsequently, a manufacturing method of the connection member according to the present embodiment will be explained. FIGS. 15A, 15B, FIGS. 16A, 16B, FIGS. 17A, 17B, FIGS. 18A, 18B, and FIG. 19 to FIG. 22 are explanatory diagrams illustrating a manufacturing method of the connection member according to the present embodiment.

Figure 15A:
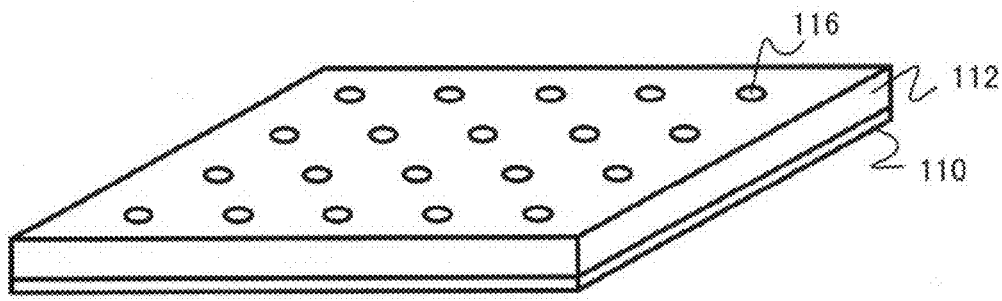
FIGS. 15A, 15B are explanatory diagrams illustrating a manufacturing method of the connection member according to the sixth embodiment.
Figure 15B:
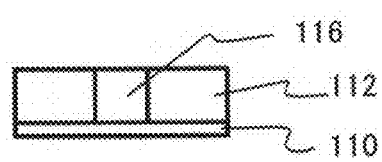

First, for example, a Cu film (metal plane) 110 of which thickness is 0.1 mm is formed by plating process on a surface of the epoxy resin (first dielectric material) 112 of which thickness is 2 mm and of which dielectric constant ∈ is 4.2. Subsequently, holes of a diameter 0.2 mm are made by drill processing, and Cu is filled therein by plating process, so that connection vias 116 are formed (FIGS. 15A, 15B).

Figure 16A:
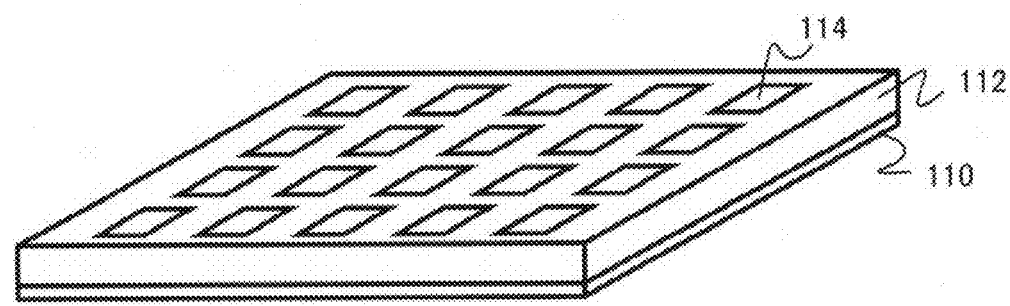
FIGS. 16A, 16B are explanatory diagrams illustrating a manufacturing method of the connection member according to the sixth embodiment.
Figure 16B:
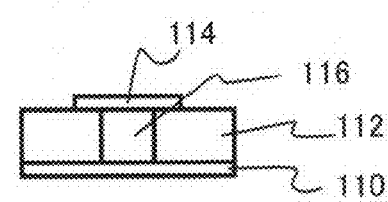

Subsequently, for example, metal patches 114 of a size 1.2 mm are formed by plating process in areas corresponding to the connection vias 116 (FIGS. 16A, 16B).

Figure 17A:
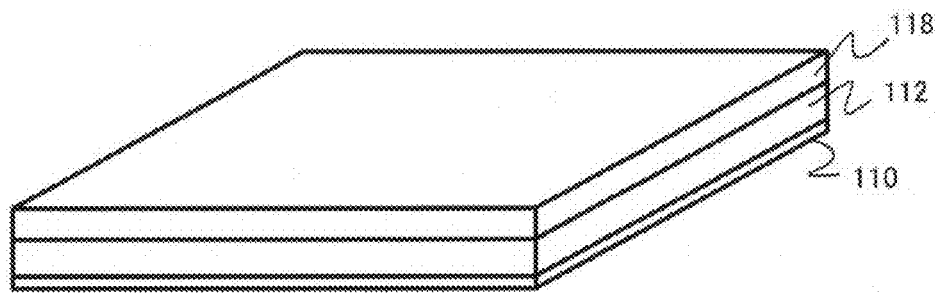
FIGS. 17A, 17B are explanatory diagrams illustrating a manufacturing method of the connection member according to the sixth embodiment.
Figure 17B:
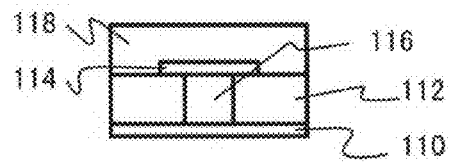
Figure 18A:
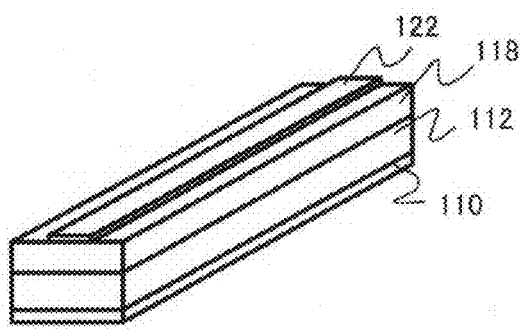
FIGS. 18A, 18B are explanatory diagrams illustrating a manufacturing method of the connection member according to the sixth embodiment.
Figure 18B:
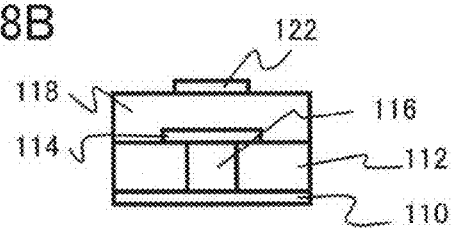

On this resin substrate, for example, the epoxy resin layer 118 of which dielectric constant ∈ is 4.2 is printed and formed as the dielectric material layer (second dielectric material) 118 using the same material as the first dielectric material 112 (FIGS. 17A, 17B). Then, after curing, for example, multiple second signal lines 122 of which line width is 1200 µm are formed by plating process, and the substrate is separated into desired shapes (FIGS. 18A, 18B).

Figure 19:
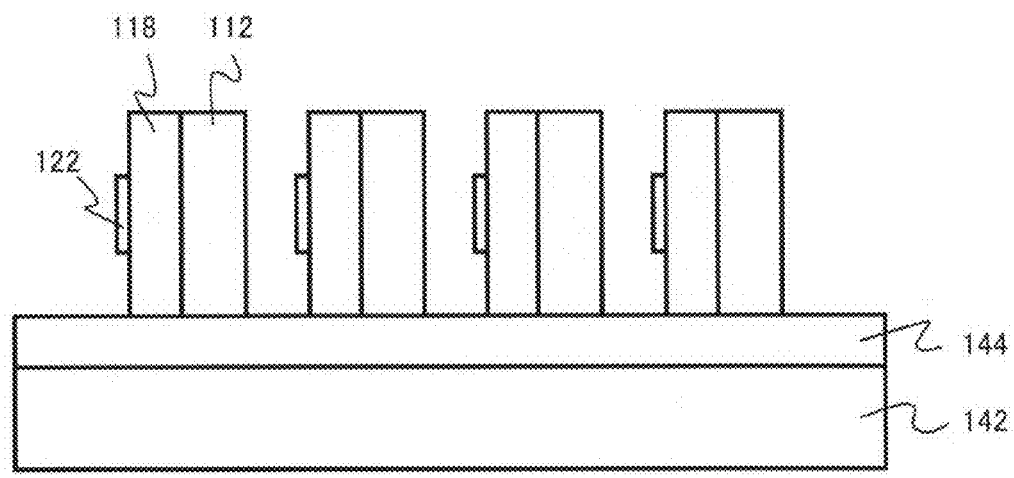
FIG. 19 is an explanatory diagram illustrating a manufacturing method of the connection member according to the sixth embodiment.
Figure 20:
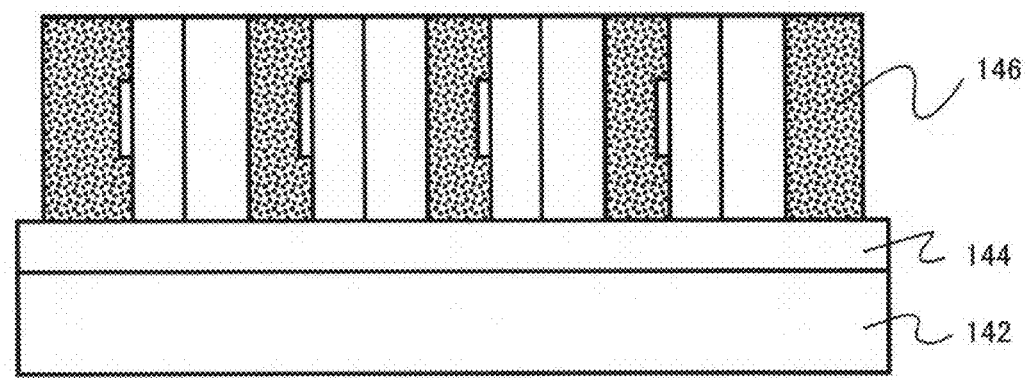
FIG. 20 is an explanatory diagram illustrating a manufacturing method of the connection member according to the sixth embodiment.
Figure 21:
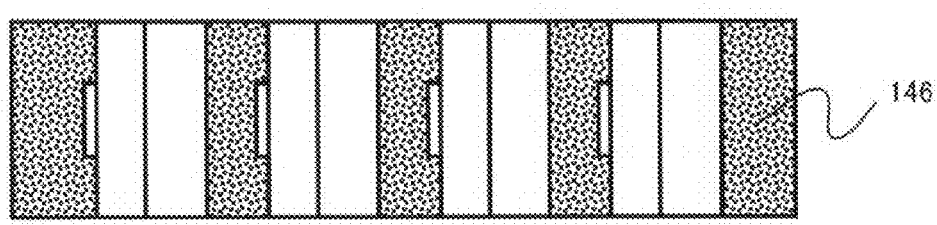
FIG. 21 is an explanatory diagram illustrating a manufacturing method of the connection member according to the sixth embodiment.

Subsequently, using a foundation substrate made by attaching an adhesive sheet 144 onto a glass substrate 142, the separated chips are implemented on the adhesive layer 144 in such orientation that side faces of the separated ships face the upper side (FIG. 19). Subsequently, water-soluble temporary adhesive agent 146 is applied (FIG. 20). After the temporary adhesive agent 146 is cured, the foundation substrate is separated (FIG. 21).

Figure 22:
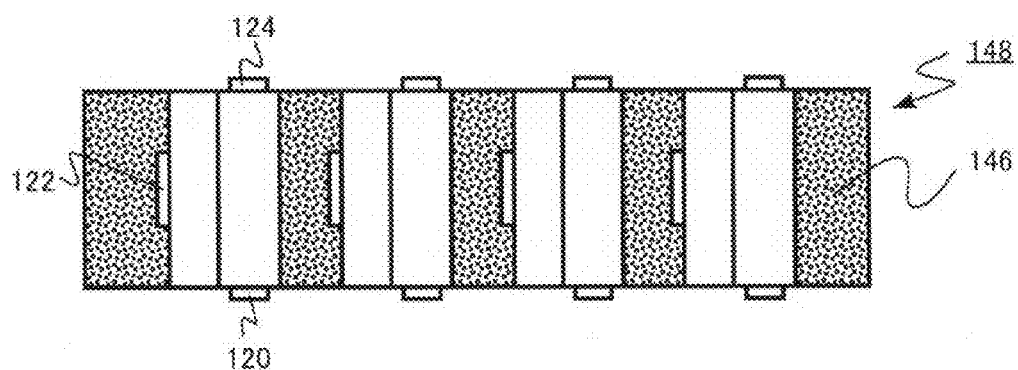
FIG. 22 is an explanatory diagram illustrating a manufacturing method of the connection member according to the sixth embodiment.

The first signal line 120 and the third signal line 124 of which line widths are 200 µm are formed by sputtering process using stainless mask on both surfaces of a reconfiguration resin substrate 148 for temporarily adhering the chips thus obtained (FIG. 22). Subsequently, a water-soluble temporary adhesive agent 146 is released.

The step of forming the solder layers 140 on both of the upper and lower surfaces of the connection member is the same as the step as shown in FIGS. 19 to 22, and the connection members are implemented on the foundation substrate including the adhesive layer 144 and the glass substrate 142 in a vertical orientation, the temporary adhesive agent is applied, the reconfiguration resin substrate is made on which the connection members are temporarily adhered, the foundation substrate is released, and thereafter, the cream solder layers 140 are applied to the upper and lower surfaces, and thereafter, the temporary adhesive agent is released, so that the connection member as shown in FIG. 14 is made.

Figure 23:
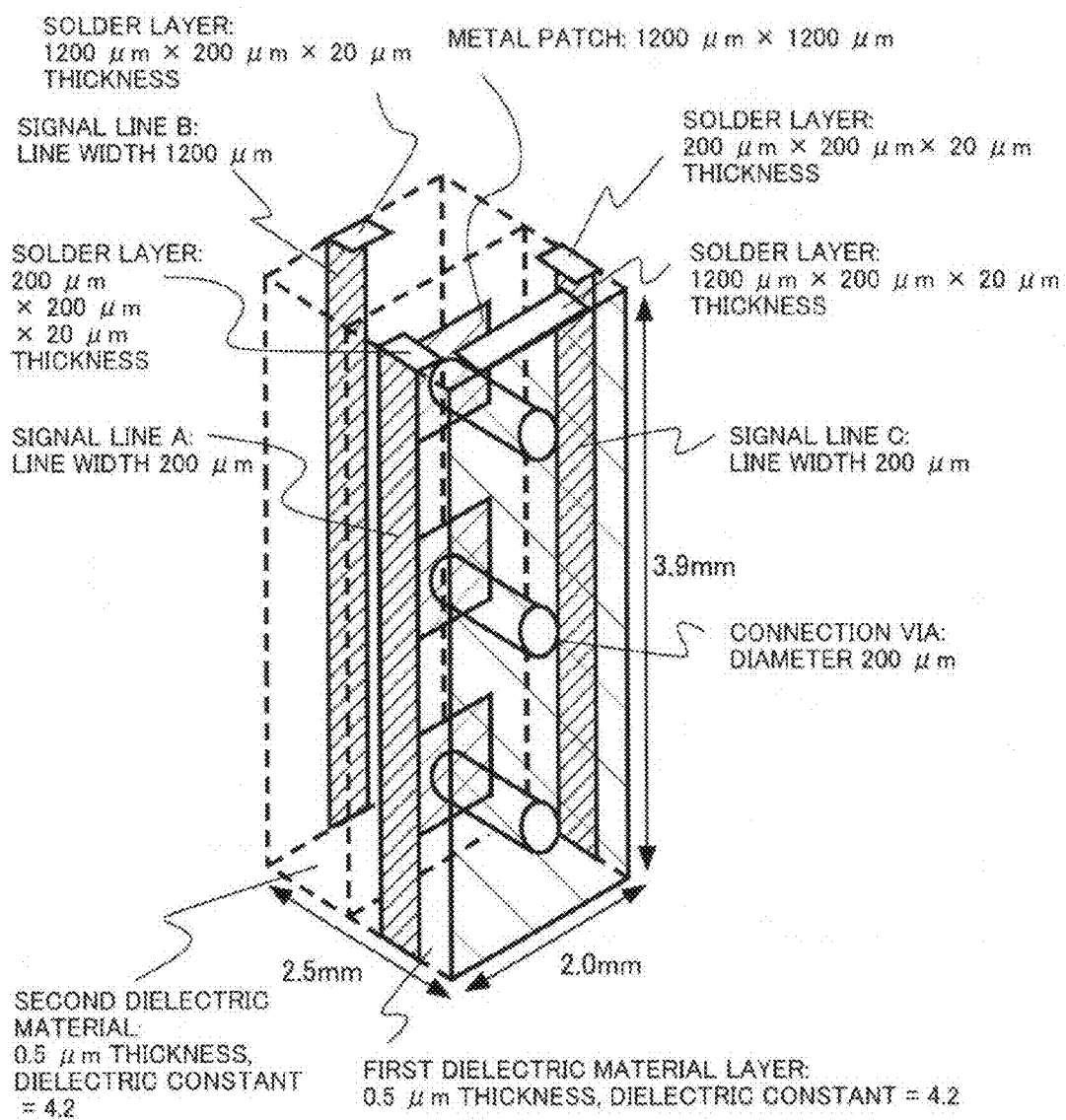
FIG. 23 is a schematic diagram illustrating a structure used for electromagnetic field analysis according to the sixth embodiment.
Figure 24:
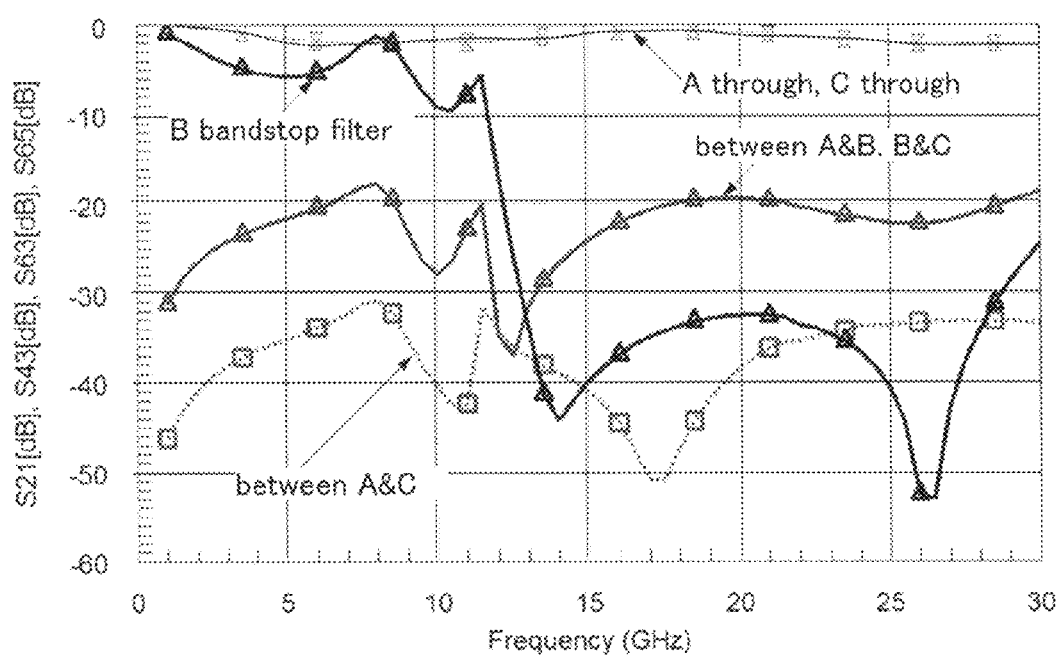
FIG. 24 is a figure illustrating a result of the electromagnetic field analysis according to the sixth embodiment.

FIG. 23 is a schematic diagram illustrating a structure used for electromagnetic field analysis according to the present embodiment. This shows a model structure for electromagnetic field analysis for the connection member. FIG. 24 is a figure illustrating a result of the electromagnetic field analysis of the connection member according to the present embodiment.

As can be seen from FIG. 24, in a wide band up to 30 GHz, the signal line A and the signal line C have low loss, and the signal line B achieves the band stop filter effect for 12 GHz. The interference suppression effect is exhibited at −18 dB or less between the signal lines A/B and between the signal lines C/B, and at −30 dB or less between the signal lines A/C.

As can be seen from such characteristics, for example, the signal lines A, C are suitable for low-loss wiring for a high frequency signal, a DC bias, and the like, and the signal line B is suitable for the power supply line.

The connection member according to the present embodiment has the EBG structure body of the mushroom structure; therefore, the connection member according to the present embodiment is provided with the filter effect and the signal interference suppression effect. Therefore, when the signals between the upper side and the lower side are transmitted using the connection members, the signals can be transmitted with a low loss and in such a manner that mutual interference therebetween is suppressed.

In the above explanation, the connection member having three signal lines has been explained as an example. Alternatively, the connection member may be configured to have a single signal line, two signal lines, or four or more signal lines.

(Seventh Embodiment)

The semiconductor device according to the present embodiment includes a connection member including a metal plane, a first dielectric material covering the metal plane, a metal patch formed with the first dielectric material interposed between the metal patch and the metal plane, a connection via provided in the first dielectric material and connecting the metal plane and the metal patch, and a first signal line formed in connection with the first dielectric material or the second dielectric material and extending in a direction perpendicular to the extension direction of the connection via. The semiconductor device according to the present embodiment is a pseudo SOC.

The connection member according to the present embodiment is the same as the connection member according to the sixth embodiment. Therefore, the same contents as those of the sixth embodiment will be omitted.

Figure 25:
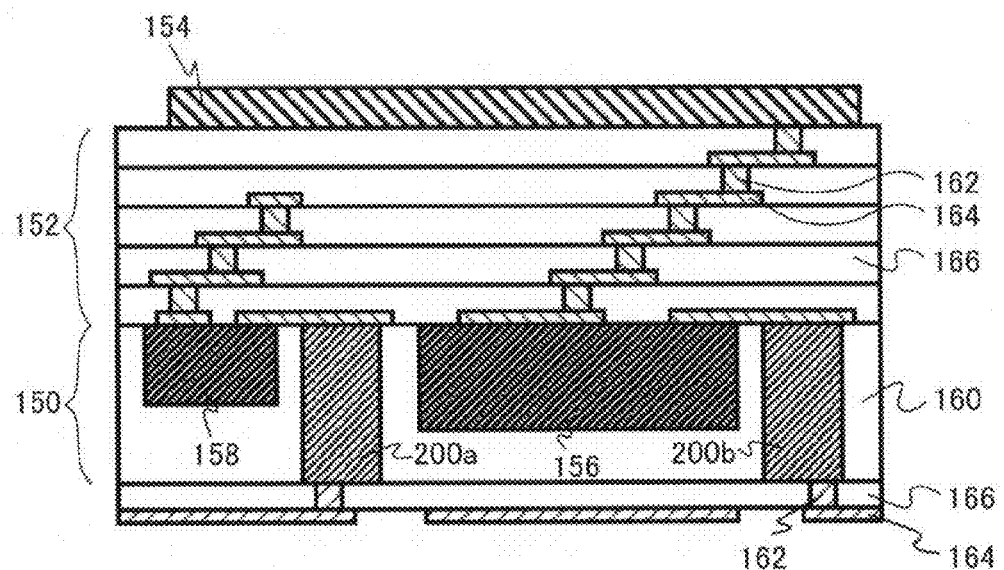
FIG. 25 is a schematic cross sectional view illustrating a semiconductor device according to a seventh embodiment.

FIG. 25 is a schematic cross sectional view illustrating the semiconductor device according to the present embodiment. The semiconductor device includes a reconfiguration substrate 150, a rewiring layer (wiring layer) 152 on the reconfiguration substrate 150, and an antenna 154 on the rewiring layer 152. The semiconductor device according to the present embodiment is three-dimensional semiconductor module.

The reconfiguration substrate 150 includes a high frequency chip 156 and a control chip 158. The control chip 158 is an example of a semiconductor chip. Further, the reconfiguration substrate 150 includes connection members 200a, 200b. The high frequency chip 156, the control chip 158, and the connection members 200a, 200b are connected with each other by the resin layer 60.

The rewiring layer 152 has a multi-layer structure including a wiring line 164, an insulation layer 166, and a via 162.

The connection members 200a, 200b are, for example, the connection member according to the sixth embodiment.

Figure 26:
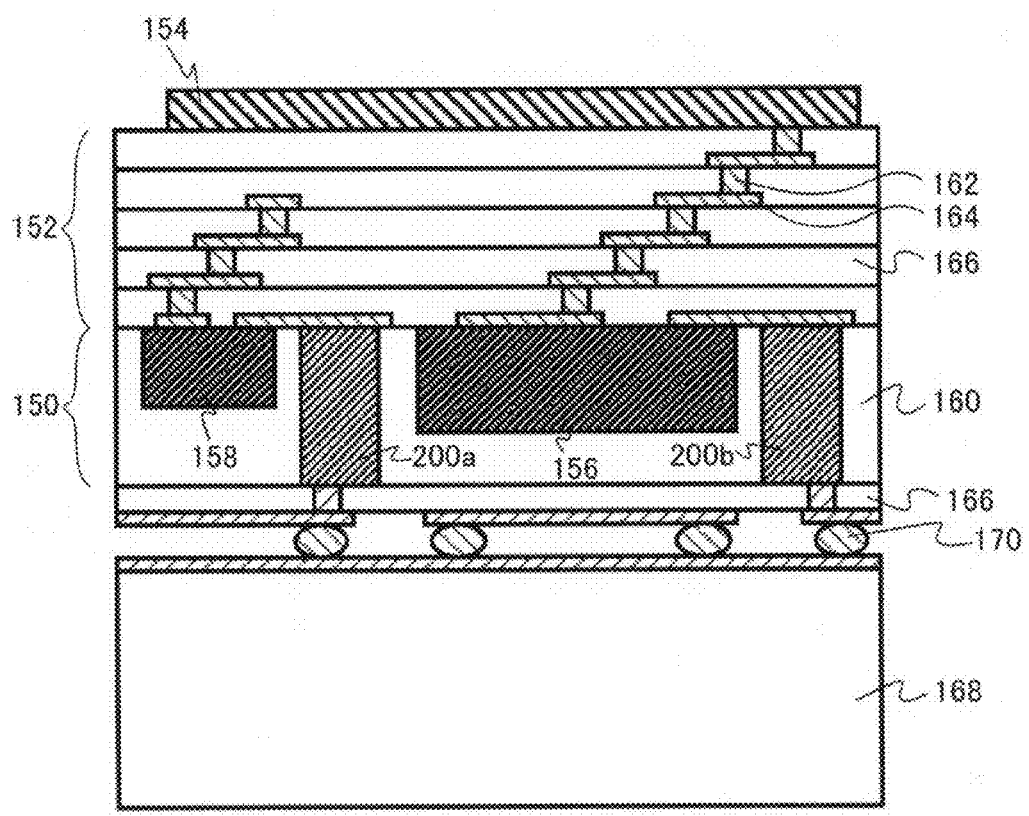
FIG. 26 is a schematic cross sectional view illustrating the semiconductor device according to the seventh embodiment.

FIG. 26 is a schematic cross sectional view illustrating the semiconductor device according to the present embodiment. For example, the semiconductor device according to the present embodiment is implemented on a printed wiring board 168 by connection bumps 170 provided on the printed wiring board 168.

In the explanation below, a manufacturing method of the semiconductor device according to the present embodiment will be explained. FIGS. 27A to 27D are explanatory diagrams illustrating a manufacturing method of the semiconductor device according to the present embodiment.

Figure 27A:
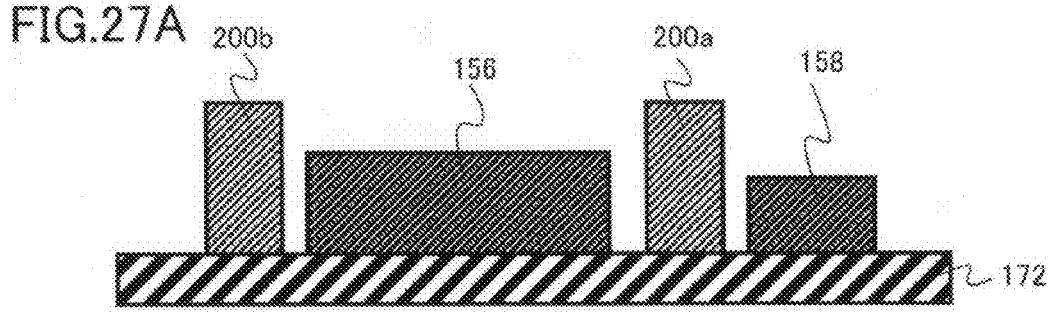
FIGS. 27A to 27D are explanatory diagrams illustrating a manufacturing method of the semiconductor device according to the seventh embodiment.
Figure 27B:
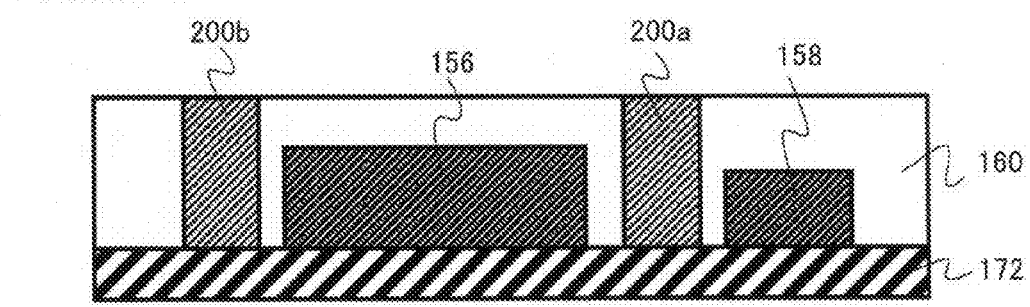

First, for example, an acrylic-based adhesive sheet 172 attached to a glass substrate of which thickness is 0.8 mm is prepared. The high frequency chip 156, the control chip 158, and the connection members 200a, 200b are implemented on the adhesive sheet 172 (FIG. 27A). Subsequently for example, a highly filled resin 160 which is made by, for example, adding silica filler to epoxy resin of acid anhydride-based curing agent at 85 wt. % is printed, and, for example, it is pre-calcinated at 100° C. (FIG. 27B).

Figure 27C:
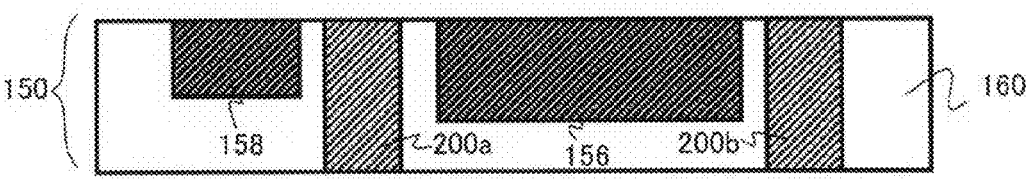
Figure 27D:
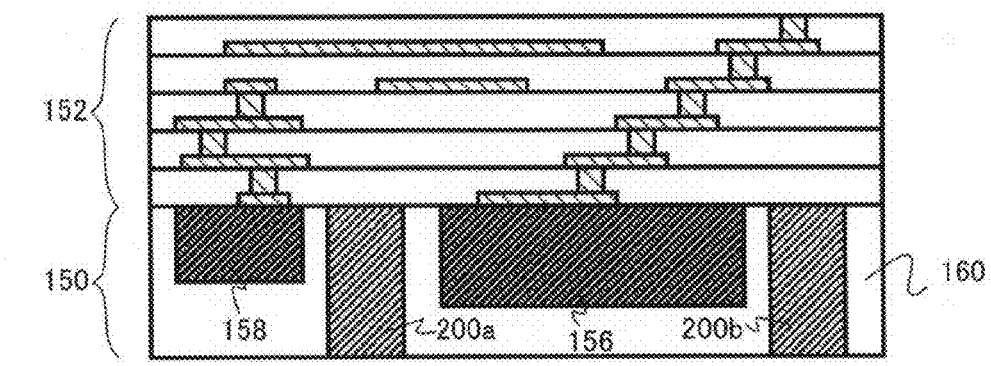

Thereafter, the adhesive sheet 172 is released, and the reconfiguration substrate 150 is obtained (FIG. 27C). On the reconfiguration substrate 150, for example, a photosensitive polyimide layer is formed, and a through-hole is formed at a desired position. After an aluminum layer is formed, patterning is made by photolithography, and aluminum fine wiring lines and vias are formed. The wiring line is formed according to the same process. Thus, the rewiring layer 152 is formed (FIG. 27D).

Thereafter, for example, the antenna 154 of the aluminum layer is patterned and formed on the uppermost layer. The wiring layer is formed on the back surface of the reconfiguration substrate 150 according to the same process, and the semiconductor device as shown in FIG. 25 is made. Thereafter, the semiconductor device is implemented on the printed wiring board 168 having the connection bumps 170 formed thereon in advance, so that the structure as shown in FIG. 26 is obtained.

According to the semiconductor device according to the present embodiment, the connection members enable the signals to be transmitted with a low loss and in such a manner that mutual interference therebetween is suppressed.

(Eighth Embodiment)

The present embodiment relates to a connection block in which multiple connection members according to the sixth embodiment are connected, and a connection pin attachment member is provided. The same contents as those of the sixth embodiment will be omitted.

Figure 28:
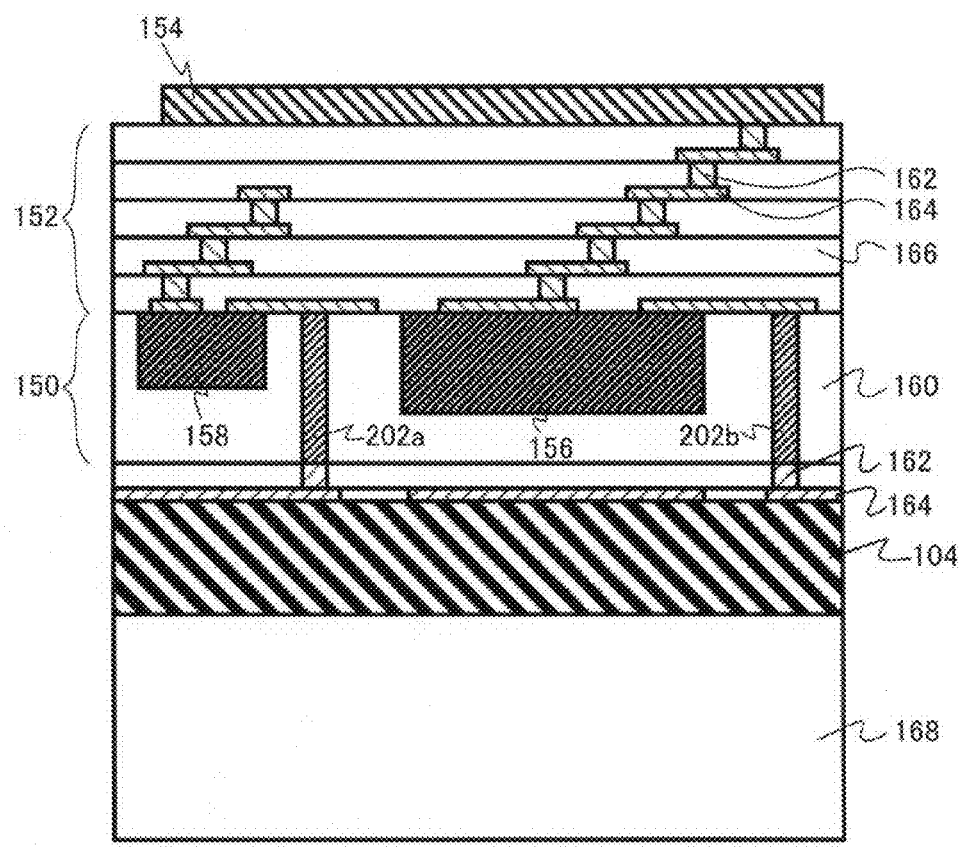
FIG. 28 is a schematic cross sectional view illustrating a circuit board having a connection unit block according to an eighth embodiment.

FIG. 28 is a schematic cross sectional view illustrating a circuit board having the connection block according to the present embodiment. The pseudo SOC semiconductor device is implemented on a printed wiring substrate 168 with the connection block 104 interposed therebetween. The pseudo SOC is electrically connected to the printed wiring substrate 168 via the penetrating vias 202*a*, 202*b* in the pseudo SOC, the via 162 and the wiring line 164 of the rewiring layer, and the connection block 104.

FIG. 29 is a schematic perspective view illustrating a connection member constituting the connection block according to the present embodiment. A connection member 200 has the same configuration as the connection member of FIG. 14 according to the sixth embodiment; therefore, description thereabout is omitted.

Figure 30A:
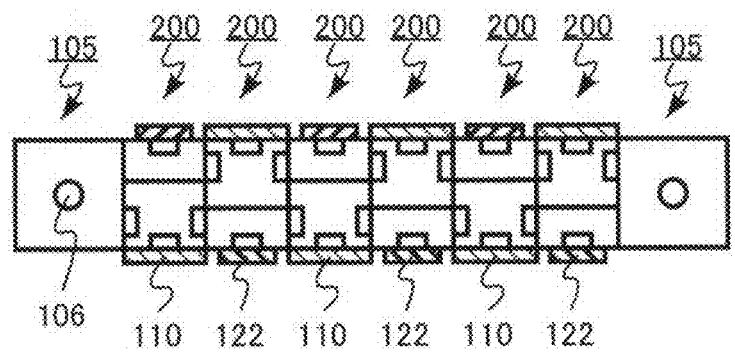
FIGS. 30A, 30B are schematic diagrams illustrating the connection unit block according to the eighth embodiment.
Figure 30B:
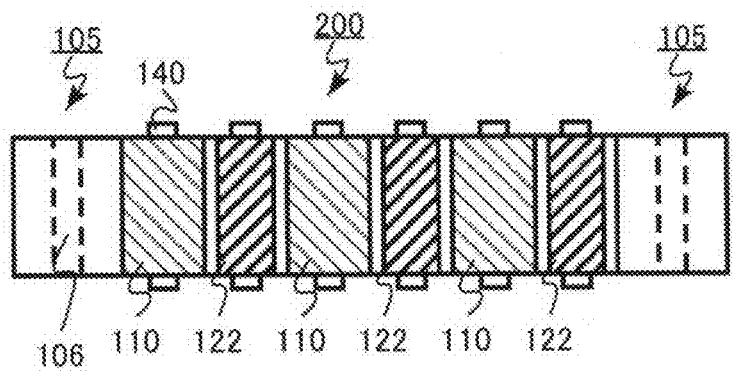

FIGS. 30A, 30B are schematic diagrams illustrating the connection block according to the present embodiment. FIG. 30A is a top view. FIG. 30B is a side view.

The connection block 104 is arranged in such a manner that a surface D of the connection member 200 at the metal plane 110 side and a surface B of the connection member 200 at the second signal line 122 side are arranged alternately so that the signal lines are not short circuited. At both ends, the connection pin attachment members 105 are provided.

The connection pin attachment member 105 is provided with a screw hole 106. The connection pin attachment member 105 is made of, for example, resin, metal, or ceramics. With the connection pin attachment member 105, for example, the pseudo SOC and the printed wiring substrate 168 are physically fixed.

Multiple connection members 200 and the connection pin attachment member 105 are fixed by, for example, adhesive agent (not shown).

When the connection block according to the present embodiment is used, the signals can be transmitted with a low loss and in such a manner that mutual interference therebetween is suppressed. The semiconductor device can be connected to the printed wiring substrate with a high degree of mechanical strength.

(Ninth Embodiment)

The stacked structure according to the present embodiment includes a connection member including a metal plane, a first dielectric material covering the metal plane, a metal patch formed with the first dielectric material interposed between the metal patch and the metal plane, a connection via provided in the first dielectric material and connecting the metal plane and the metal patch, and a first signal line formed in connection with the first dielectric material or the second dielectric material and extending in a direction perpendicular to the extension direction of the connection via, and also includes a first circuit board.

In addition, the stacked structure according to the present embodiment further includes a second circuit board under the first circuit board. The connection member is provided between the first circuit board and the second circuit board. The first circuit board and the second circuit board are electrically connected by the connection member.

The details of the connection member and the connection block are the same as those of the sixth embodiment or the eighth embodiment, and description thereabout is omitted.

Figure 31:
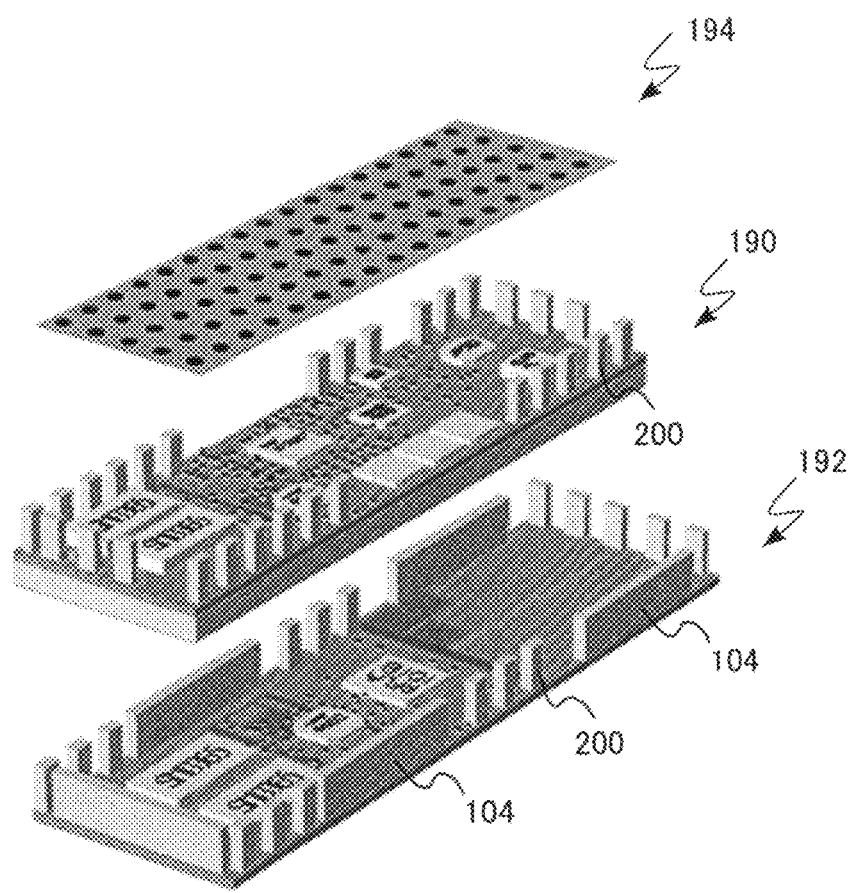
FIG. 31 is a schematic diagram illustrating a stacked structure according to a ninth embodiment.

FIG. 31 is a schematic diagram illustrating the stacked structure according to the present embodiment. The stacked structure according to the present embodiment includes a first circuit board 190, a second circuit board 192, and an EBG (Electromagnetic Band Gap) structure body 194. The stacked structure according to the present embodiment is a stacked-type circuit board for high frequency.

The second circuit board 192 is provided under the first circuit board 190. The first circuit board 190 and the second circuit board 192 are stacked. The connection members 200 and the connection blocks 104 are provided between the first circuit board 190 and the second circuit board 192. The first circuit board 190 and the second circuit board 192 are electrically connected by the connection member 200 and the connection blocks 104. The connection members 200 and the connection blocks 104 also function as the spacers between the first circuit board 190 and the second circuit board 192.

The EBG structure body 194 is provided above the first circuit board 190. The first circuit board 190 and the EBG structure body 194 are stacked. Multiple connection members 200 are provided between the first circuit board 190 and the EEG structure body 194. The first circuit board 190 and the EBG structure body 194 are electrically connected by the multiple connection members 200. The multiple connection members 200 also function as the spacers between the first circuit board 190 and the EBG structure body 194. The EBG structure body 194 has, for example, a mushroom-type structure therein, and has electromagnetic field shielding effect.

In the present embodiment, the connection members and the connection blocks are used for joining the substrates. Therefore, when the signals are transmitted using the connection members and the connection blocks having the filter effect, the signals can be transmitted with a low loss and in such a manner that mutual interference therebetween is suppressed. With the EBG structure provided in the connection members and the connection blocks, the effect of absorbing the electromagnetic noise can be obtained. Therefore, three-dimensional signal transmission can be achieved in such a state that it is less likely to be affected by electromagnetic noises generated by the circuit board in the stacked structure.

(Tenth Embodiment)

The stacked structure according to the present embodiment is different from the ninth embodiment in that the stacked structure according to the present embodiment further includes a shielding wall provided on an external periphery of a first circuit board. Therefore, the same contents as those of the ninth embodiment will be omitted.

Figure 32:
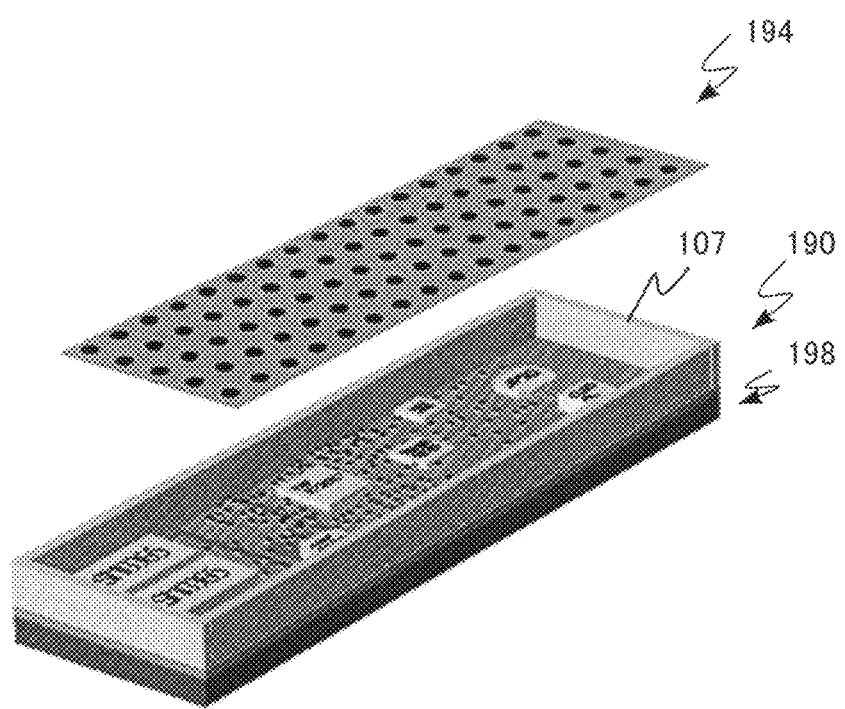
FIG. 32 is a schematic diagram illustrating a stacked structure according to a tenth embodiment.

FIG. 32 is a schematic diagram illustrating the stacked structure according to the present embodiment. The stacked structure according to the present embodiment includes a first circuit board 190 and an EBG (Electromagnetic Band Gap) structure body 194. In addition, the stacked structure according to the present embodiment includes a ground substrate 198 at a side of the first circuit board 190 opposite to the EBG structure body 194. The stacked structure according to the present embodiment is a stacked-type circuit board for high frequency. The shielding wall 107 is provided on the external periphery of the first circuit board 190.

FIGS. 33A, 33B are schematic diagrams illustrating constituent elements of a shielding wall according to the present embodiment. FIG. 33A illustrates the EBG member. FIG. 33B illustrates a connection member.

The EBG member 203 has a mushroom structure, and has the electromagnetic field shielding effect. The EBG member 203 includes a second metal plane 210, a third dielectric material 212 covering the second metal plane 210, a second metal patch 214 formed with the third dielectric material 212 interposed between the second metal patch 214 and the second metal plane 210, and a second connection via 216 provided in the third dielectric material 212 and connecting the second metal plane 210 and the second metal patch 214.

The connection member 200 is the same as that of the sixth embodiment.

Figure 34A:
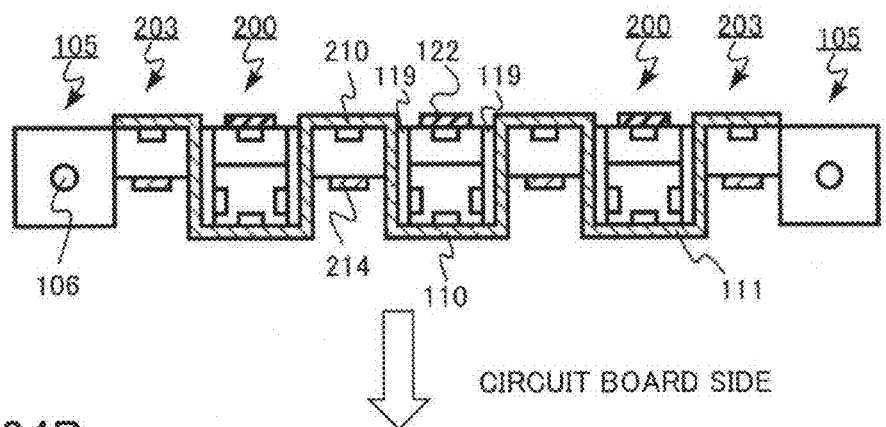
FIGS. 34A, 34B are schematic diagrams illustrating the shielding wall according to the tenth embodiment.
Figure 34B:
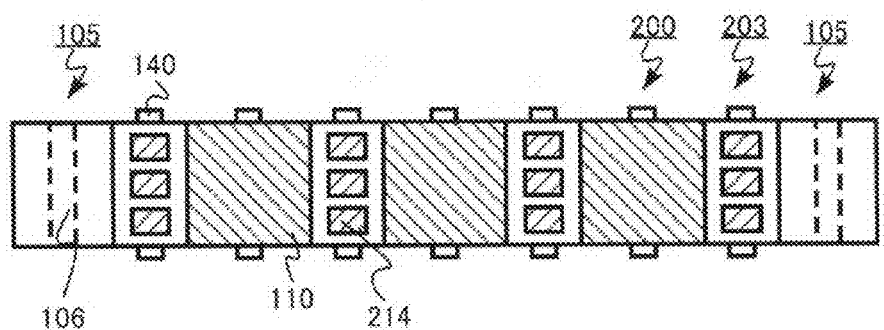

FIGS. 34A, 34B are schematic diagrams illustrating the shielding wall according to the present embodiment. FIG. 34A is a top view. FIG. 34B is a side view.

The shielding wall 107 is configured such that the connection members 200 and the EBG members 203 are arranged alternately. At both ends, the connection pin attachment members 105 are provided.

The connection member 200 is arranged in such orientation that the first metal patch 114 faces the outside of the first circuit board 190 with respect to the first metal plane 110. The EBG member 203 is arranged in such orientation that the second metal patch 214 faces the inner side of the first circuit board 190 with respect to the second metal plane 210.

The first metal plane 110 and the second metal plane 210 are connected and fixed at the ground potential. As a result, the inner side of the first circuit board 190 is surrounded by a common ground plane 111 in an uneven shape provided at the external periphery of the first circuit board 190.

The connection pin attachment member 105 is provided with a screw hole 106. The connection pin attachment member 105 is made of, for example, resin, metal, or ceramics.

The multiple connection members 200, 203 and the connection pin attachment members 105 are fixed by, for example, adhesive agent (not shown).

Since the shielding wall according to the present embodiment is used, the signals can be transmitted with a low loss and in such a manner that mutual interference therebetween is suppressed. The semiconductor device can be connected to the printed wiring substrate with a high degree of mechanical strength.

In the stacked structure according to the present embodiment, electromagnetic noises generated in the vertical direction is shielded by the ground substrate 198 of the lowermost layer and the EBG structure body 194 of the uppermost layer. In addition, the effect of absorbing electromagnetic noises because of the EBG structure provided with the connection members 200 and the EBG structure bodies 203 formed in the shielding wall 107 provided at the external periphery of the first circuit board 190 in the horizontal direction. Therefore, the electromagnetic noises generated by the first circuit board 190 are absorbed. Therefore, electromagnetic noises generated in the stacked structure are not reflected and absorbed by the upper and lower wall surfaces and side walls. The signal lines formed in the connection member 200 are arranged outside of the ground plane and the EBG structure of the shielding wall 107; therefore, three-dimensional signal transmission can be achieved without being affected by electromagnetic noises.

Subsequently, a manufacturing method of the shielding wall according to the present embodiment will be explained. FIGS. 35 to 42 are explanatory diagrams illustrating a manufacturing method of the shielding wall according to the present embodiment.

Figure 35:
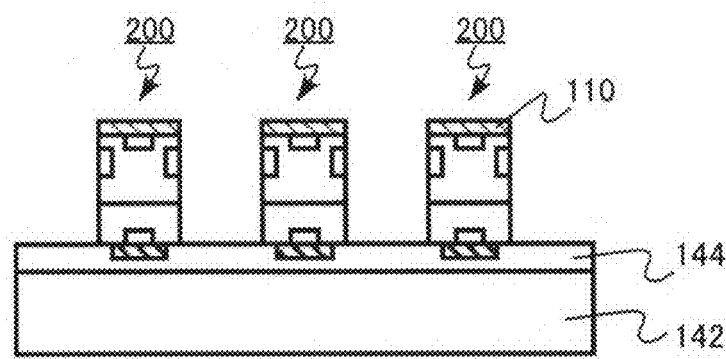
FIG. 35 is an explanatory diagram illustrating a manufacturing method of the shielding wall according to the tenth embodiment.
Figure 36:
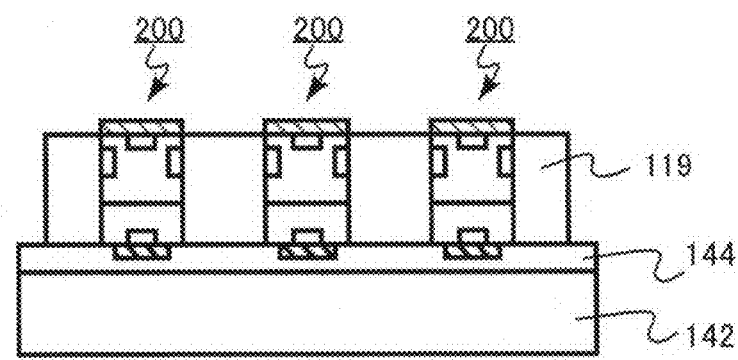
FIG. 36 is an explanatory diagram illustrating a manufacturing method of the shielding wall according to the tenth embodiment.
Figure 37:
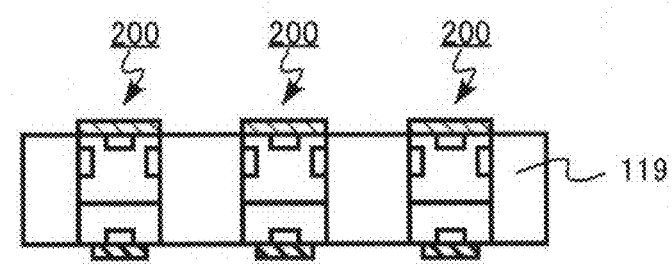
FIG. 37 is an explanatory diagram illustrating a manufacturing method of the shielding wall according to the tenth embodiment.

First, the connection members 200 are implemented on the adhesive layer 144 on the glass substrate 142 in such orientation that the metal planes 110 are at the upper side (FIG. 35). Subsequently, the dielectric material 119 is formed (FIG. 36). Subsequently, the adhesive layer 144 is released (FIG. 37).

Figure 38:
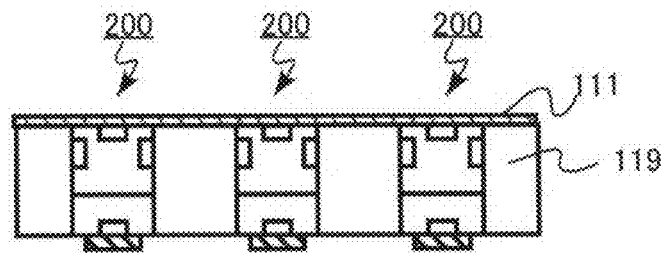
FIG. 38 is an explanatory diagram illustrating a manufacturing method of the shielding wall according to the tenth embodiment.
Figure 39:
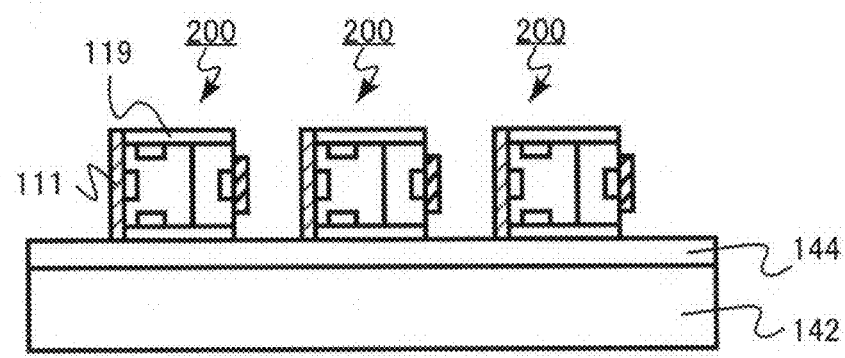
FIG. 39 is an explanatory diagram illustrating a manufacturing method of the shielding wall according to the tenth embodiment.
Figure 40:
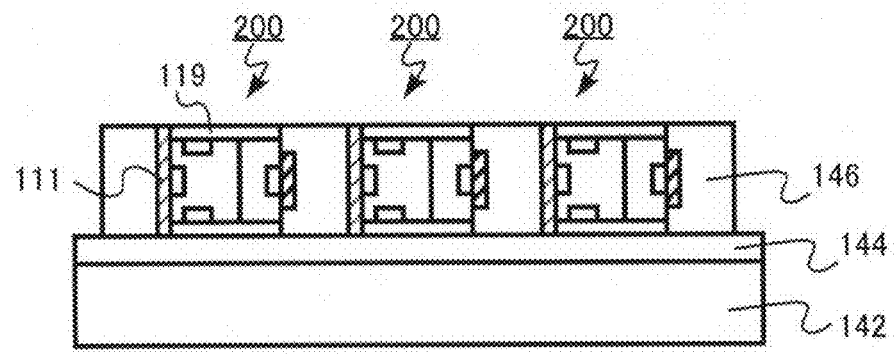
FIG. 40 is an explanatory diagram illustrating a manufacturing method of the shielding wall according to the tenth embodiment.

Subsequently, the common ground plane 111 is formed so that the metal planes 110 are conductive with each other (FIG. 38). Subsequently, the separated connection members 200 are implemented on the adhesive layer 144 on the glass substrate 142 in such orientation that the common ground plane 111 is in the horizontal direction (FIG. 39). Subsequently, the connection members 200 are fixed with the temporary adhesive agent 146 (FIG. 40).

Figure 41:
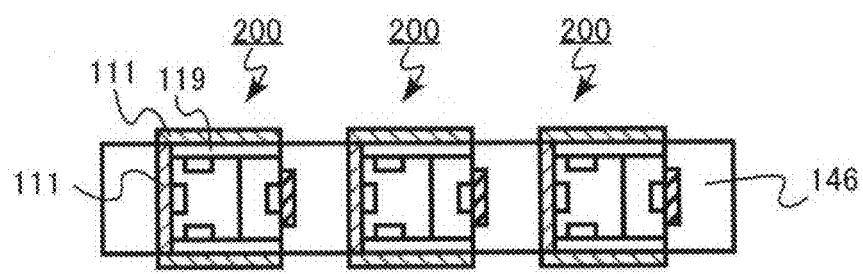
FIG. 41 is an explanatory diagram illustrating a manufacturing method of the shielding wall according to the tenth embodiment.
Figure 42:
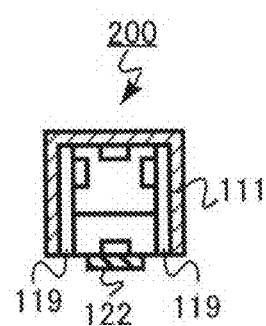
FIG. 42 is an explanatory diagram illustrating a manufacturing method of the shielding wall according to the tenth embodiment.

Thereafter, the adhesive layer 144 is released, and the common ground planes 111 are also formed on the dielectric material 119 (FIG. 41). Then, when the temporary adhesive agent 146 is released, the connection member 200 is obtained, which has the common ground planes 111 formed on the three side surfaces. Thereafter, the connection member 200, the EBG member 203, and the connection pin attachment member 105 are adhered and connected. The shielding wall 107 is manufactured according to the above manufacturing method.

(Eleventh Embodiment)

The stacked structure according to the present embodiment is different from the tenth embodiment in that the stacked structure according to the present embodiment further includes a second circuit board and a shielding wall provided on an external periphery of the second circuit board, and has a different configuration in the shielding wall. The same contents as those of the tenth embodiment will be omitted.

Figure 43:
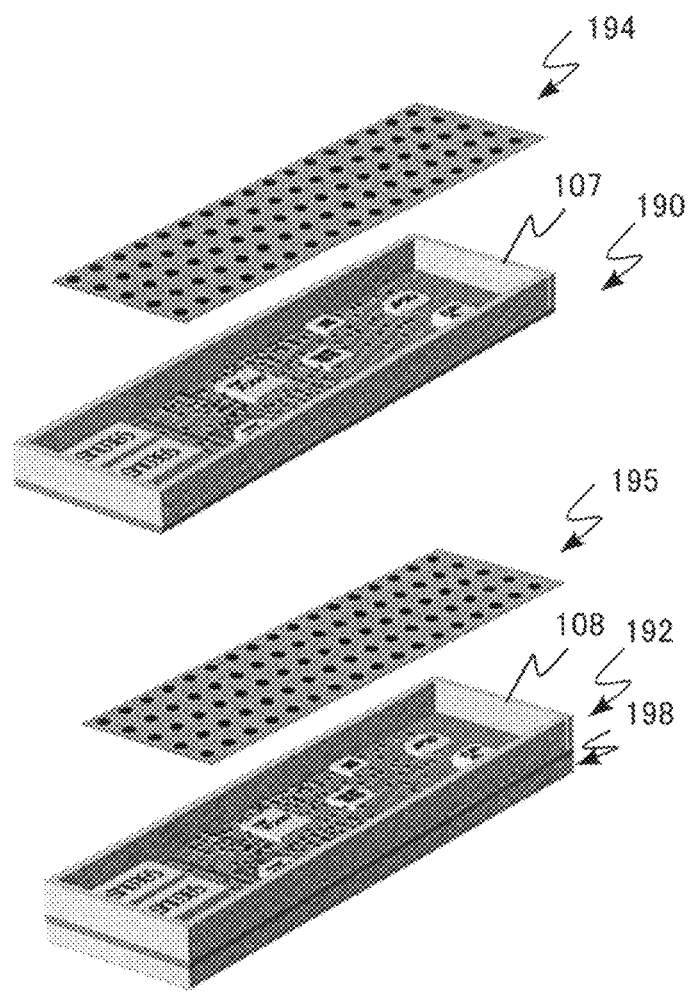
FIG. 43 is a schematic diagram illustrating a stacked structure according to an eleventh embodiment.

FIG. 43 is a schematic diagram illustrating the stacked structure according to the present embodiment. The stacked structure according to the present embodiment includes a first circuit board 190, and an EBG (Electromagnetic Band Gap) structure body 194 on the first circuit board 190.

In addition, the stacked structure according to the present embodiment includes an EBG structure body 195 at a side of the first circuit board 190 opposite to the EBG structure body 194, and more specifically, the EBG structure body 195 is under the first circuit board 190. Further, the stacked structure according to the present embodiment includes a second circuit board 192 provided under the EBG structure body 195. In addition, the stacked structure according to the present embodiment includes a ground substrate 198 at a side of the second circuit board 192 opposite to the EBG structure body 195.

The stacked structure according to the present embodiment is a stacked-type circuit board for high frequency. The shielding wall 107 is provided on the external periphery of the first circuit board 190. A shielding wall 108 is provided on the external periphery of the second circuit board 192.

Figure 44A:
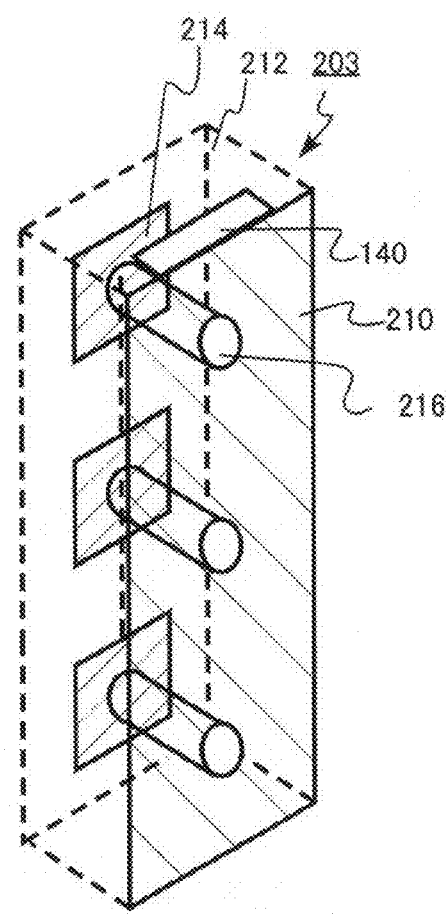
FIGS. 44A, 44B are schematic diagrams illustrating constituent elements of the shielding wall according to the eleventh embodiment.
Figure 44B:
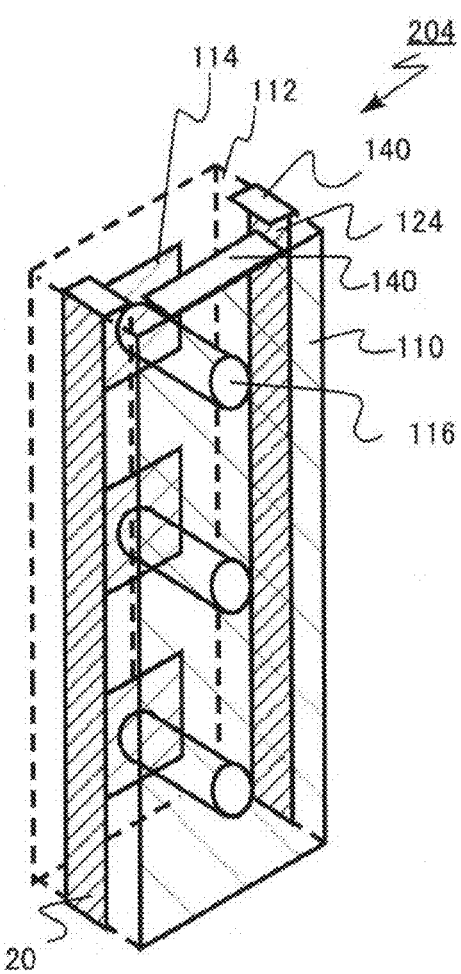

FIGS. 44A, 44B are schematic diagrams illustrating constituent elements of the shielding wall according to the present embodiment. FIG. 44A illustrates the EBG member. FIG. 44B illustrates the connection member.

The EBG member 203 has a mushroom structure, and has the electromagnetic field shielding effect. The EBG member 203 includes a second metal plane 210, a third dielectric material 212 covering the second metal plane 210, a second metal patch 214 formed with the third dielectric material 212 interposed between the second metal patch 214 and the second metal plane 210, and a second connection via 216 provided in the third dielectric material 212 and connecting the second metal plane 210 and the second metal patch 214.

The connection member 204 is different from the connection member 200 according to the tenth embodiment in that the connection member 204 does not have the second dielectric material 118 and the second signal line 122 on the metal patch 140.

Figure 45A:
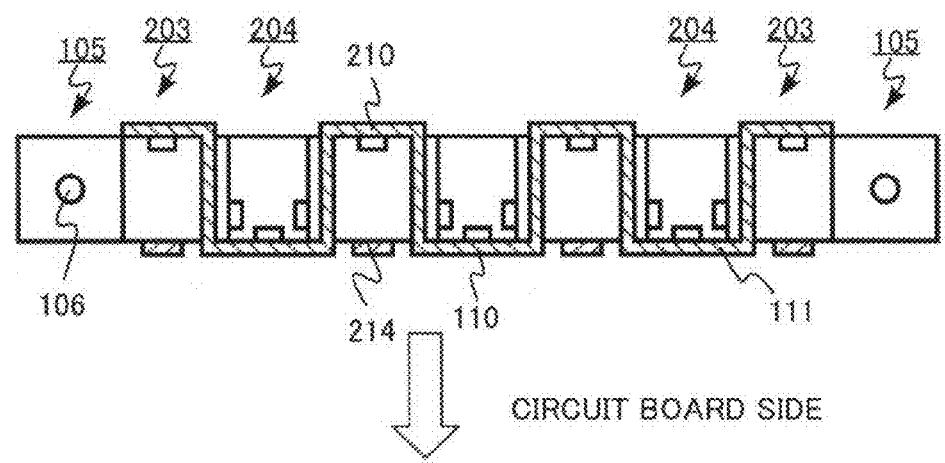
FIGS. 45A, 45B are schematic diagrams illustrating the shielding wall according to the eleventh embodiment.
Figure 45B:
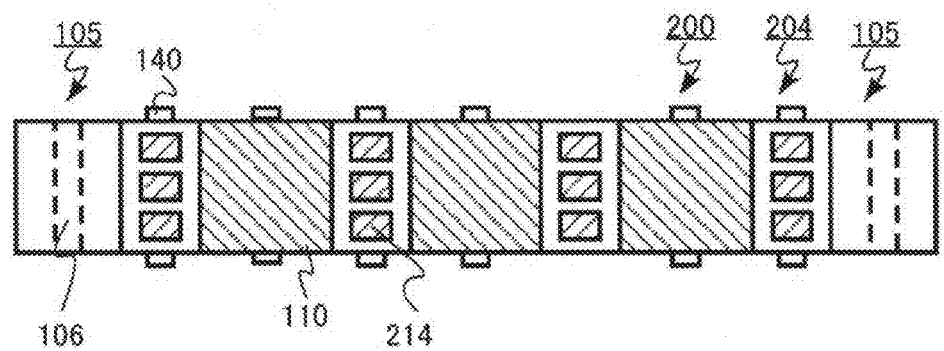

FIGS. 45A, 45B are schematic diagrams illustrating the shielding wall according to the present embodiment. FIG. 45A is a top view. FIG. 45B is a side view.

The shielding wall 107 and the shielding wall 108 are such that the connection members 204 and the EBG members 203 are arranged alternately. At both ends, the connection pin attachment members 105 are provided.

The connection member 200 is arranged in such orientation that the first metal patch 114 of the connection member 204 faces the outside of the first circuit board 190 with respect to the first metal plane 110. The EBG member 203 is arranged in such orientation that the second metal patch 214 of the EBG member 203 faces the inner side of the first circuit board 190 with respect to the second metal plane 210.

The first metal plane 110 and the second metal plane 210 are connected and fixed at the ground potential. As a result, the inner side of the first circuit board 190 is surrounded by a common ground plane 111 in an uneven shape provided at the external periphery of the first circuit board 190, and the inner side of the second circuit board 192 is surrounded by a common ground plane 111 in an uneven shape provided at the external periphery of the second circuit board 192.

The connection pin attachment member 105 is provided with a screw hole 106. The connection pin attachment member 105 is made of, for example, resin, metal, or ceramics.

Multiple connection members 200 and the connection pin attachment member 105 are fixed by, for example, adhesive agent (not shown).

Since the shielding wall 107 and the shielding wall 108 according to the present embodiment are used, the signals can be transmitted with a low loss and in such a manner that mutual interference therebetween is suppressed. The semiconductor device can be connected to the printed wiring substrate with a high degree of mechanical strength.

In the stacked structure according to the present embodiment, electromagnetic noises generated in the vertical direction is shielded by the ground substrate 198 of the lowermost layer and the EBG structure body 194 of the uppermost layer. In addition, the effect of absorbing electromagnetic noises because of the EBG structure provided with the connection members 204 and the EBG structure bodies 203 formed in the shielding wall 107 provided at the external periphery of the first circuit board 190 in the horizontal direction. Therefore, the electromagnetic noises generated by the first circuit board 190 are absorbed. In addition, the effect of absorbing electromagnetic noises because of the EBG structure provided with the connection members 204 and the EBG structure bodies 203 formed in the shielding wall 108 provided at the external periphery of the second circuit board 192 in the horizontal direction. Therefore, the electromagnetic noises generated by the second circuit board 192 are absorbed. Therefore, electromagnetic noises generated in the stacked structure are not reflected and absorbed by the upper and lower wall surfaces and side walls. Since the signal lines formed in the connection member 204 are arranged outside of the common ground plane 111 and the EBG structure of the shielding walls 107, 108, three-dimensional signal transmission can be achieved without being affected by electromagnetic noises.

(Twelfth Embodiment)

The stacked structure according to the present embodiment is different from the eleventh embodiment in the configuration of the shielding wall. The same contents as those of the eleventh embodiment will be omitted.

Figure 47:
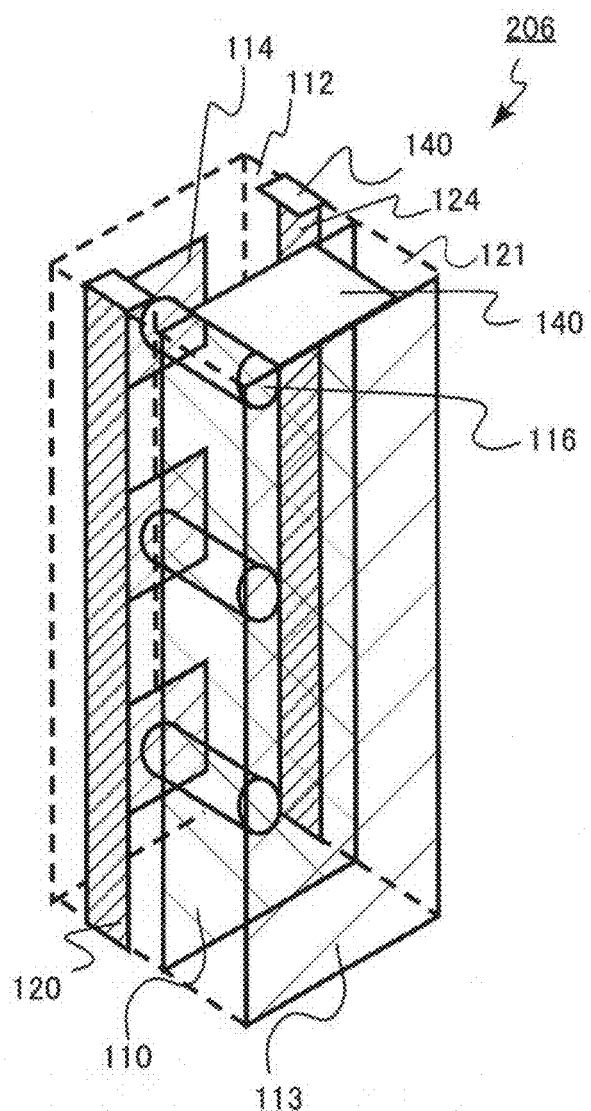
FIG. 47 is a schematic diagram illustrating constituent elements of the shielding wall according to the twelfth embodiment.

FIGS. 46A, 46B, FIG. 47 are schematic diagrams illustrating constituent elements of the shielding wall according to the present embodiment. FIG. 46A illustrates a first EBG member. FIG. 46B illustrates a second EBG member. FIG. 47 illustrates a connection member.

The first EBG member 203 has a mushroom structure, and has the electromagnetic field shielding effect. The first EBG member 203 includes a second metal plane 210, a third dielectric material 212 covering the second metal plane 210, a second metal patch 214 formed with the third dielectric material 212 interposed between the second metal patch 214 and the second metal plane 210, and a second connection via 216 provided in the third dielectric material 212 and connecting the second metal plane 210 and the second metal patch 214. The second EBG member 205 has such a configuration that two first EBG members 203 are connected.

The connection member 206 is different from the connection member 204 according to the eleventh embodiment in that the connection member 206 has a metal plane 113 with a dielectric material 121 interposed between the metal plane 113 and the metal plane 110.

Figure 48A:
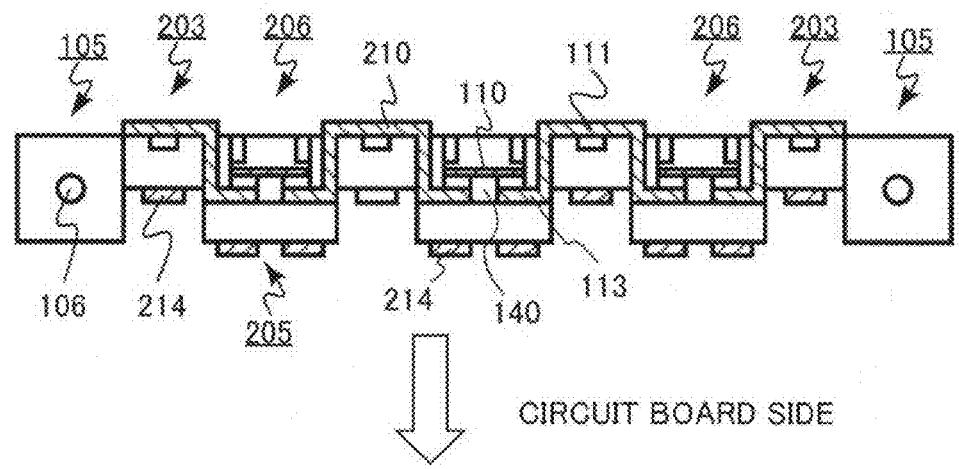
FIGS. 48A, 48B are schematic diagrams illustrating the shielding wall according to the twelfth embodiment.
Figure 48B:
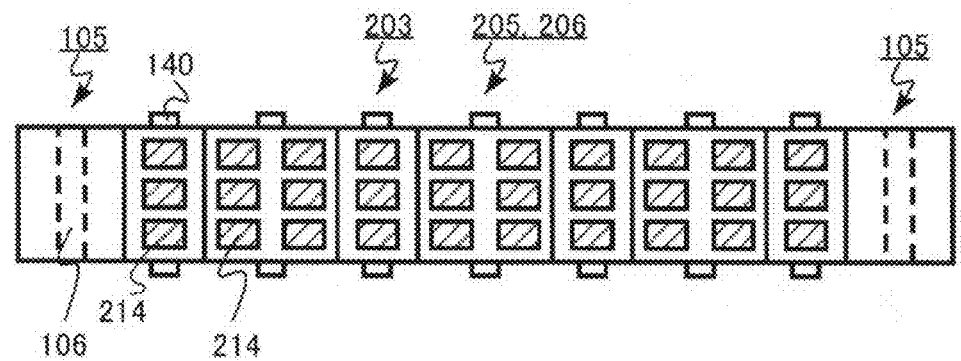

FIGS. 48A, 48B are schematic diagrams illustrating the shielding wall according to the present embodiment. FIG. 48A is a top view. FIG. 48B is a side view.

The shielding wall is such that the second EBG member 205 is pasted to the connection member 206 in such orientation that the metal plane 113 and the metal plane 210 are in contact with each other. Then, the connection members 206 and the first EBG members 203 are configured to be arranged alternately. At both ends, the connection pin attachment members 105 are provided.

The connection member 200 is arranged in such orientation that the first metal patch 114 faces the outside of the first circuit board 190 with respect to the first metal plane 110. The EBG member 203 is arranged in such orientation that the second metal patch 214 faces the inner side of the first circuit board 190 with respect to the second metal plane 210.

The first metal plane 110 and the second metal plane 210 are connected and fixed at the ground potential. As a result, the inner side of the first circuit board 190 is surrounded by a common ground plane 111 in an uneven shape provided at the external periphery of the first circuit board 190, and the inner side of the second circuit board 192 is surrounded by a common ground plane 111 in an uneven shape provided at the external periphery of the second circuit board 192.

The connection pin attachment member 105 is provided with a screw hole 106. The connection pin attachment member 105 is made of, for example, resin, metal, or ceramics.

Multiple connection members 200 and the connection pin attachment member 105 are fixed by, for example, adhesive agent (not shown).

According to the present embodiment, the same effects as those of the twelfth embodiment can be obtained.

(Thirteenth Embodiment)

In the past, in a high frequency device for a high frequency signal, the signal processed therein is high power (up to several watts) and the frequency thereof is high (several hundred MHz to several hundred GHz), and it is particularly difficult to make a simple package and make the high frequency device into a module because of the necessity of electrical impedance matching, the loss reduction, and the like. In many cases, the high frequency device is made such that an individual high frequency signal processing chip is sealed into metal, ceramics, and their package materials, and thereafter, the high frequency device is configured as a module implemented on an implementation substrate together with other devices such as passive components.

For example, in order to achieve not only electrical impedance matching at an input/output unit but also reduction of insertion loss of an electric signal, a high frequency chip called an MMIC (Monolithic Microwave Integrated Circuit) is made by die bonding with a package material made of metal, ceramics, or composite materials thereof using a material such as Au, Au(Sn), and thereafter, wire bonded with Au lines, and the chip is sealed in an air tight manner with hermetic seal, and thus, it is completed as a package. They are implemented on an implementation substrate together with capacitors, inductors, resistors, and the like using solder, wire bonding, and the like, and wiring lines are applied therebetween, so that the high frequency module that functions as a whole is completed. In the high frequency device, the frequency processed therein extends to a range of several digits, and power at various levels is passed through the device; therefore, it is necessary to select a package and implementation method suitable for the usage situation of each of them.

In recent years, SoC (System on Chip) and SiP (System in Package) have been suggested as high-density packaging technology, and this intensifies the competition of development from the perspective of reduction in the size, higher integration, higher number of functions, low cost, and the like. In these techniques, multiple semiconductor chips of which functions are different are configured as a single package or module. The bonding technique of the chips is not limited to the wire bonding but interlayer moving wiring techniques such as penetrating electrodes, bump electrodes, direct bonding of substrates are also used.

The interlayer moving wiring technique roughly involve two issues. The first issue is that it is difficult to make a wiring line in which potential becomes zero in the vertical direction; therefore, when the electric current passage flowing in this direction exists, the loss occurs in an input signal. The second issue is that when the passage of the electric current is converted in the vertical direction, the electromagnetic field rapidly changes; therefore, the loss occurs in the input signal. An object which is to be solved by the present embodiment is to provide a semiconductor device and a manufacturing method thereof capable of improving the loss of the input signal that occurs at bonding of multiple semiconductor chips having different functions by using the technique of the interlayer moving wiring technique.

The semiconductor device according to the present embodiment includes a semiconductor chip, an insulation layer formed on a peripheral portion of the semiconductor chip, the insulation layer having a dielectric constant less than that of the semiconductor chip and including an inclined surface extending from the peripheral portion of the semiconductor chip to the inner side, multiple wiring layers formed on the inclined surface, and a cap portion which is provided on the insulation layer and which forms a hollow portion between the cap portion and the semiconductor chip, wherein the cap portion has a penetrating via connected to the wiring layer, and the dielectric constant of the cap portion is higher than that of the insulation layer.

Figure 49A:
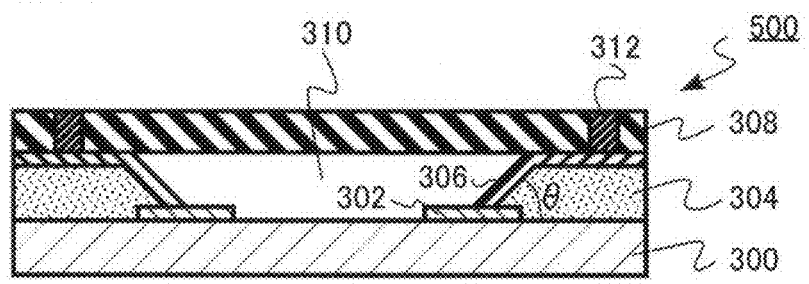
FIGS. 49A, 49B are schematic diagrams illustrating a semiconductor device according to a thirteenth embodiment.
Figure 49B:
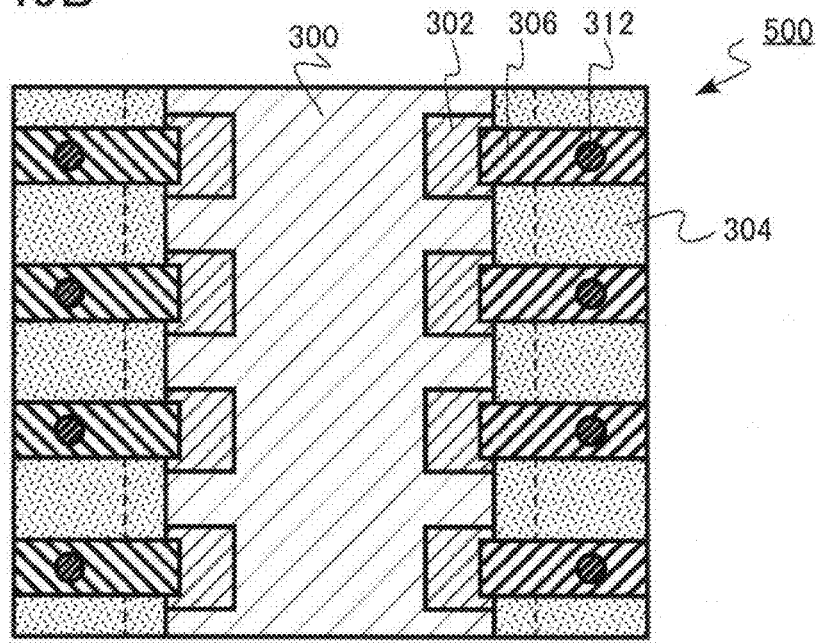

FIGS. 49A, 49B are schematic diagrams illustrating the semiconductor device according to the present embodiment. FIG. 49A is a schematic cross sectional view. FIG. 49B is a schematic top view.

A semiconductor device 500 according to the present embodiment includes a high frequency chip 300 which is an example of semiconductor chip. The high frequency chip 300 is, for example, a GaAs semiconductor chip. The high frequency chip 300 has electrode pads 302 on the top surface thereof.

Insulation layers 304 of which dielectric constant is less than that of the high frequency chip 300 are formed on the peripheral portion of the high frequency chip 300. The insulation layer 304 includes an inclined surface extending from the peripheral portion of the high frequency chip 300 to the inner side. The insulation layer 304 is, for example, resin. The insulation layer 304 is, for example, PMMA or epoxy resin.

The inclined surface of the insulation layer 304 has multiple wiring layers 306 formed thereon. The wiring layer 306 is a metal wiring line. The multiple wiring layers 306 include, for example, a ground line, a power supply line, a signal line, and the like.

A cap portion 308 is formed on the insulation layer 304. The cap portion 308 has a higher dielectric constant than the insulation layer 304. The cap portion 308 forms a hollow portion 310 between the high frequency chip 300 and the cap portion 308. The cap portion 308 is, for example, high resistance silicon.

The cap portion 308 has penetrating vias 312 formed to be connected to the wiring layer 306. The penetrating via 310 is made of metal.

Subsequently, a manufacturing method of the semiconductor device according to the present embodiment will be explained. FIGS. 50A to 50G are explanatory diagrams illustrating the manufacturing method of the semiconductor device according to the present embodiment.

Figure 50A:
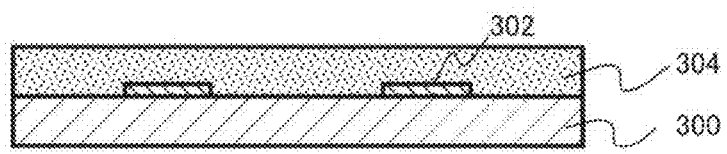
FIGS. 50A to 50G are explanatory diagrams illustrating a manufacturing method of the semiconductor device according to the thirteenth embodiment.

The insulation layer 304 is formed on the high frequency chip 300 and the electrode pads 302 (FIG. 50A). The insulation layer 304 is, for example, polyimide. The thickness of the insulation layer 304 is, for example, equal to or more than 10 μm and equal to or less than 80 μm.

Figure 50B:
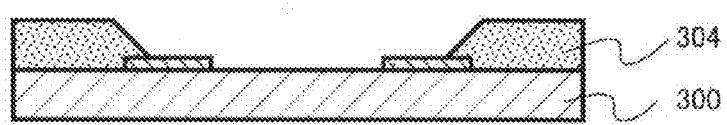

Subsequently, the insulation layer 304 is patterned (FIG. 50B). At this occasion, the insulation layer 304 is processed to have an inclined surface extending from the peripheral portion of the high frequency chip 300 to the inner side. When the insulation layer 304 is polyimide, processing is performed by photolithography.

Figure 50C:
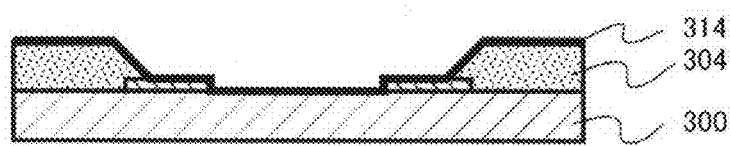

Subsequently, a thin metal film 314 is formed on the high frequency chip 300 and the insulation layer 304 (FIG. 50C). The thin metal film 314 is, for example, a Cu (copper) film formed by sputtering method. The thickness of the Cu film is, for example, about 1 μm.

Figure 50D:
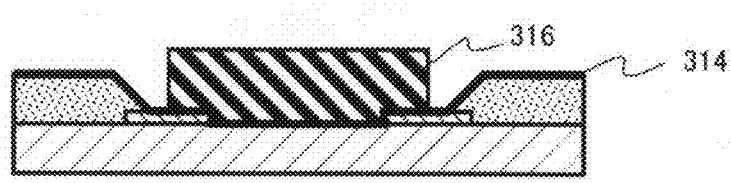

Subsequently, the pattern is formed on the thin metal film 314 using the resist 316 (FIG. 50D). The thickness of the resist 316 is, for example, equal to or more than 1 μm and equal to or less than 10 μm.

Figure 50E:
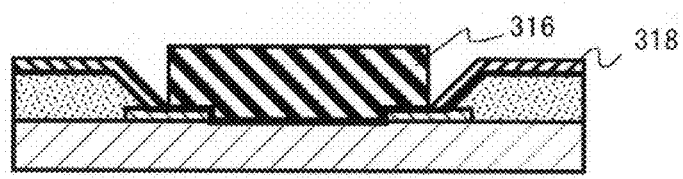

Subsequently, the metal film 318 is formed on the thin metal film 314 (FIG. 50E). The metal film 318 is, for example, a Cu film made by electroplating method.

Figure 50F:
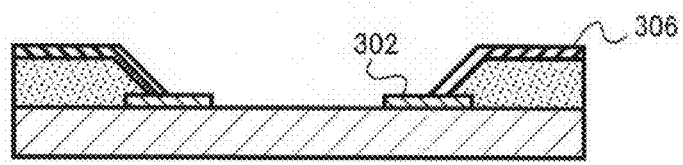

Subsequently, the resist 316 and the thin metal film 314 are removed (FIG. 50F). Accordingly, the wiring layers 306 connected to the electrode pads 302 are formed.

Figure 50G:
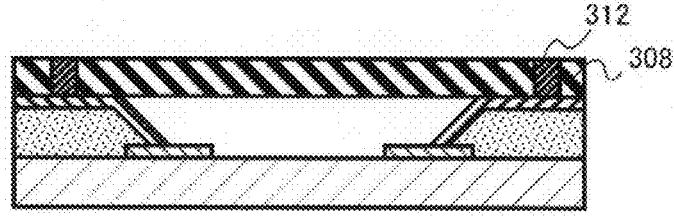

Thereafter, the cap portion 308 having the penetrating vias 312 is formed on the insulation layer 304 (FIG. 50G). The cap portion 308 is formed using, for example, a flip chip bonder or a normal temperature bonding apparatus.

According to the above steps, the semiconductor device according to the present embodiment as shown in FIGS. 49A, 49B is produced.

Subsequently, the functions and effects of the semiconductor device according to the present embodiment will be explained.

Figure 51A:
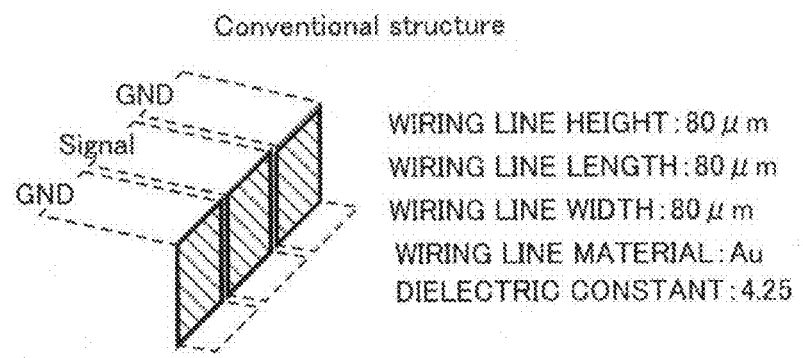
FIGS. 51A, 51B are figures illustrating a structure used for a simulation according to the thirteenth embodiment.
Figure 51B:
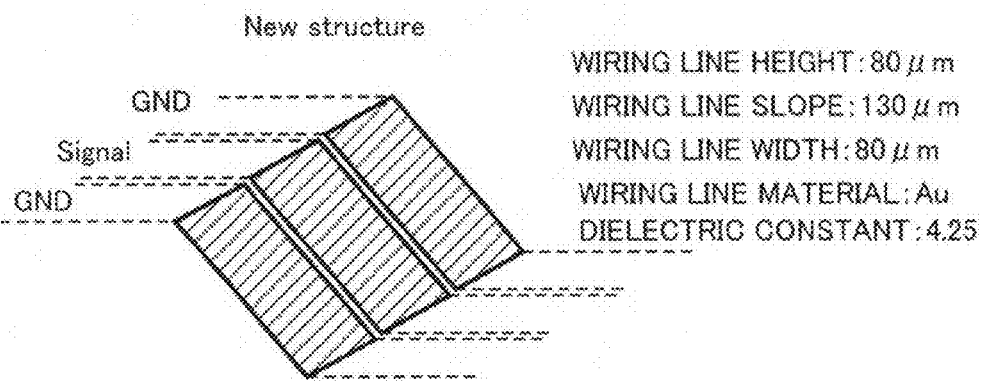

FIGS. 51A, 51B are figures illustrating a structure used for simulation. FIG. 51A illustrates a comparative mode. FIG. 513 illustrates the present embodiment. In the comparative mode, the wiring line is bent at a right angle. The pass characteristics (S21) of the signal line sandwiched by two ground lines are derived by simulation. The present embodiment is different from the comparative mode in that wiring lines is provided on an inclined surface.

Figure 52:
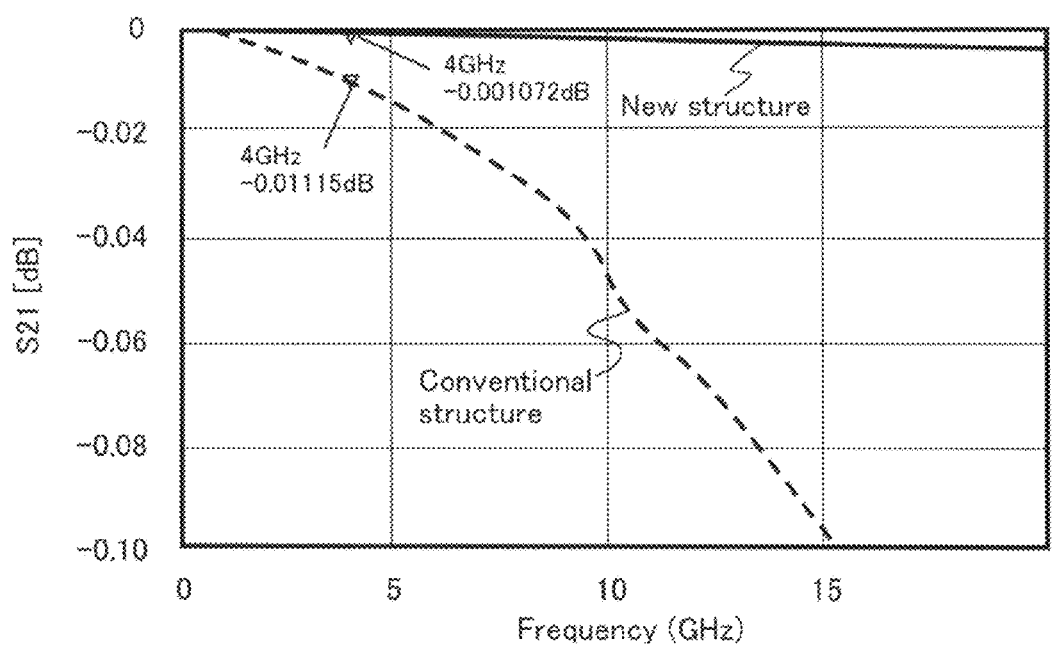
FIG. 52 is a figure illustrating a result of the simulation according to the thirteenth embodiment.

FIG. 52 is a figure illustrating the pas characteristics of the signal line which is a figure illustrating simulation result. In contrast to the comparative mode (Conventional structure), the embodiment (New structure) has an effect of improvement of the loss by 0.01 dB at 4 GHz and 0.06 dB at 10 GHz.

Figure 53:
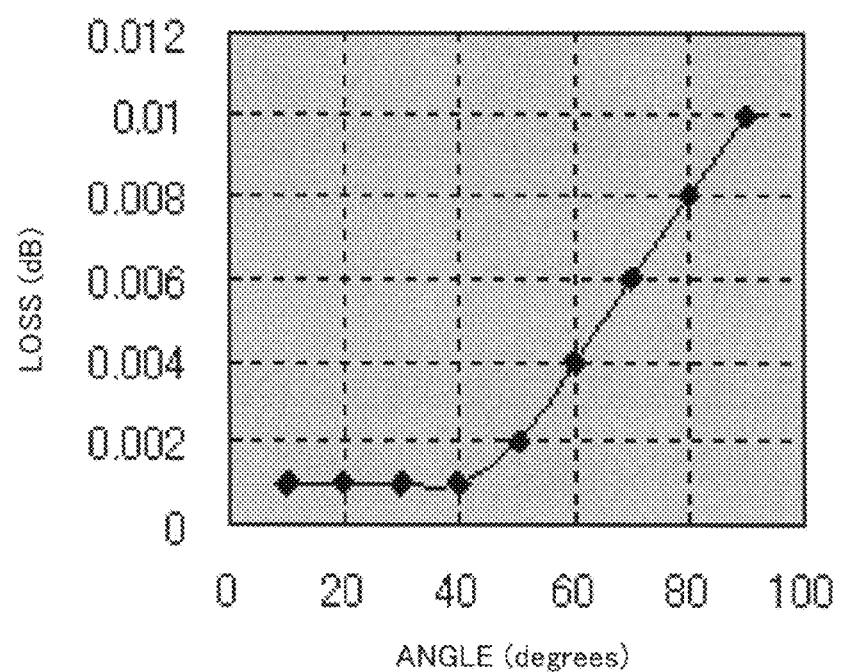
FIG. 53 is a figure illustrating angle dependency according to which loss is dependent upon an angle of an inclination surface according to the thirteenth embodiment.

FIG. 53 is a figure illustrating angle dependency according to which loss is dependent upon an angle of an inclination surface. The angle of the inclined surface is an inclination angle of the inclined surface of the insulation layer 304 with respect to the surface of the semiconductor chip 300. The angle of the inclined surface corresponds to an angle θ shown in FIG. 49A.

As is evident from FIG. 53, the lower the angle of the inclined surface is, the lower the loss becomes. The inclination angle is preferably equal to or less than 45 degrees from the perspective of reduction of the loss. More preferably, the inclination angle is 40 degrees or less. On the other hand, the inclination angle is preferably 20 degrees or more from the perspective of forming the inclined surface in a stable manner during the processing.

The present embodiment is particularly effective when the semiconductor chip is a high frequency chip.

From the perspective of reducing the loss, the dielectric constant of the insulation layer 304 is preferably 4.25 or less.

As explained above, the semiconductor device that reduces the loss of the input/output signal is achieved according to the present embodiment.

(Fourteenth Embodiment)

A semiconductor device according to the present embodiment is a semiconductor module including the semiconductor device according to the thirteenth embodiment. The same contents as those of the thirteenth embodiment will be omitted.

Figure 54:
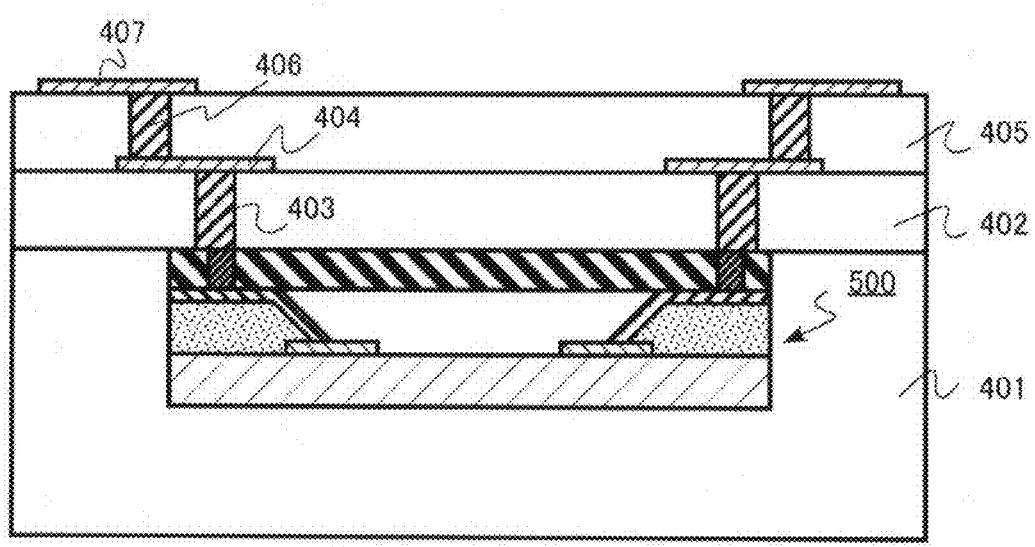
FIG. 54 is a schematic cross sectional view illustrating a semiconductor device according to a fourteenth embodiment.

FIG. 54 is a schematic cross sectional view illustrating the semiconductor device according to the present embodiment. The semiconductor device 500 is embedded in the resin layer 401. The insulation layer 402 is formed on the semiconductor device 500. Penetrating electrodes 403 are formed in the insulation layer 402. Wiring layers 404 are formed on the insulation layer 402. An insulation layer 405 is formed on the wiring layer 404 and the insulation layer 402. Penetrating electrodes 406 are provided in the insulation layer 405. Wiring layers 407 are formed on the insulation layer 405. Further, the insulation layer and the wiring layer may be repeatedly provided.

As explained above, the semiconductor module that reduces the loss of the input/output signal is achieved according to the present embodiment.

In the embodiment, the pseudo SOC is explained as an example of semiconductor device. However, the semiconductor device is not limited to the pseudo SOC. The present embodiment can also be applied to other semiconductor devices.

While certain embodiments have been described, these embodiments have been presented by way of example only, and are not intended to limit the scope of the inventions. Indeed, connection member, semiconductor device, and stacked structure described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A connection member comprising: a dielectric material; a penetrating via penetrating through the dielectric material; a first metal plane provided in the dielectric material, the first meta plane being perpendicular to an extension direction of the penetrating via, the first metal plane crossing the penetrating via, the first metal plane connected to the penetrating via; and a second metal plane provided in or on the dielectric material, the second metal plane provided in parallel with the extension direction of the penetrating via, the second metal plane directly connected to the first metal plane, the second metal plane having a plate-shape, wherein the second metal plane includes a first wide portion, a second wide portion, a third wide portion, a first narrow portion and a second narrow portion, the first narrow portion provide between the first wide portion and the second wide portion, the second narrow portion provided between the second wide portion and the third wide portion.

2. The connection member according to claim 1 further comprising a third metal plane provided in the dielectric material, the third metal plane being perpendicular to the extension direction of the penetrating via, the third metal plane crossing the penetrating via, the third metal plane connected to the second metal plane.

3. The connection member according to claim 1, wherein the second metal plane includes wide portions and narrow portions connecting the wide portions.

4. The connection member according to claim 1 further comprising:
a third metal plane provided parallel to the extension direction of the penetrating via, the third metal plane connected to the first metal plane, the third metal plane facing the second metal plane, the penetrating via interposed between the second metal plane and the third metal plane;
a fourth metal plane provided in the dielectric material, the fourth metal being perpendicular to the extension direction of the penetrating via, the fourth metal crossing the penetrating via;
a fifth metal plane provided in parallel with the extension direction of the penetrating via, the fifth metal plane connected to the fourth metal plane; and
a sixth metal plane provided in parallel with the extension direction of the penetrating via, the sixth metal plane connected to the fourth metal plane, the sixth metal plane facing the fifth metal plane, the penetrating via interposed between the fifth metal plane and sixth metal plane.

5. The connection member according to claim 1, wherein the second wide portion is directly connected to the first metal plane.

6. The connection member according to claim 1, wherein the dielectric material includes resin filled with filler.

* * * * *